US009852687B2

(12) United States Patent
Tsuge et al.

(10) Patent No.: US 9,852,687 B2
(45) Date of Patent: Dec. 26, 2017

(54) DISPLAY DEVICE AND DRIVING METHOD

(71) Applicant: JOLED INC., Tokyo (JP)

(72) Inventors: Hitoshi Tsuge, Tokyo (JP); Kouhei Ebisuno, Tokyo (JP); Shigeo Homura, Tokyo (JP)

(73) Assignee: JOLED INC., Tokyo (JP)

( * ) Notice: Subject to any disclaimer, the term of this patent is extended or adjusted under 35 U.S.C. 154(b) by 54 days.

(21) Appl. No.: 14/915,347

(22) PCT Filed: Jun. 9, 2014

(86) PCT No.: PCT/JP2014/003071
§ 371 (c)(1),
(2) Date: Feb. 29, 2016

(87) PCT Pub. No.: WO2015/033496
PCT Pub. Date: Mar. 12, 2015

(65) Prior Publication Data
US 2016/0210898 A1 Jul. 21, 2016

(30) Foreign Application Priority Data

Sep. 4, 2013 (JP) ................................ 2013-183312

(51) Int. Cl.
*G09G 3/3233* (2016.01)
*G09G 3/3266* (2016.01)
*H01L 27/32* (2006.01)

(52) U.S. Cl.
CPC ......... *G09G 3/3233* (2013.01); *G09G 3/3266* (2013.01); *G09G 2300/0819* (2013.01);
(Continued)

(58) Field of Classification Search
None
See application file for complete search history.

(56) References Cited

U.S. PATENT DOCUMENTS 7,605,543 B2   10/2009   Lee et al.
7,671,826 B2    3/2010   Kimura
(Continued)

FOREIGN PATENT DOCUMENTS

JP    2005-164894    6/2005
JP    2005-275369   10/2005
(Continued)

OTHER PUBLICATIONS

Search Report from PCT/JP2014/003071, dated Aug. 26, 2014.

*Primary Examiner* — Patrick Edouard
*Assistant Examiner* — Matthew Yeung
(74) *Attorney, Agent, or Firm* — Greenblum & Bernstein, P.L.C.

(57) ABSTRACT

A display device comprising pixel circuits arranged in a matrix, in which each of the pixel circuits includes: an EL element; a capacitor for storing voltage; a drive transistor that provides, to the EL element, a current corresponding to the voltage stored in the capacitor to cause the EL element to emit light; a voltage supplier that applies a reference voltage to the drive transistor in an initialization period, and applies a reverse bias voltage to the drive transistor in a predetermined period before the initialization period, the reference voltage being higher than a threshold voltage of the drive transistor and providing a forward bias between the gate and source electrodes of the drive transistor, the initialization period being a period for initializing the pixel circuit, the reverse bias voltage providing a reverse bias between the gate and source electrodes of the drive transistor.

5 Claims, 12 Drawing Sheets

(52) U.S. Cl.
CPC ............... *G09G 2300/0842* (2013.01); *G09G 2310/0254* (2013.01); *G09G 2310/0256* (2013.01); *G09G 2320/0223* (2013.01); *G09G 2320/043* (2013.01); *H01L 27/3244* (2013.01)

(56) References Cited

U.S. PATENT DOCUMENTS

| | | |
|---|---|---|
| 8,264,430 B2 | 9/2012 | Kimura |
| 8,269,698 B2 | 9/2012 | Lee et al. |
| 8,274,454 B2 | 9/2012 | Yamamoto et al. |
| 8,614,652 B2 | 12/2013 | Nathan et al. |
| 8,717,261 B2 | 5/2014 | Kimura |
| 8,823,610 B2 | 9/2014 | Miyazawa |
| 2005/0083270 A1 | 4/2005 | Miyazawa |
| 2005/0212444 A1 | 9/2005 | Lee et al. |
| 2007/0126665 A1* | 6/2007 | Kimura ................ G09G 3/3233 345/76 |
| 2008/0001857 A1* | 1/2008 | Yoo ...................... G09G 3/3233 345/76 |
| 2008/0170011 A1* | 7/2008 | Kohno ................ G09G 3/3233 345/77 |
| 2008/0211746 A1* | 9/2008 | Caligiore ............ G09G 3/3233 345/76 |
| 2009/0219231 A1 | 9/2009 | Yamamoto et al. |
| 2010/0039458 A1 | 2/2010 | Nathan et al. |
| 2010/0149160 A1 | 6/2010 | Kimura |
| 2010/0156880 A1 | 6/2010 | Lee et al. |
| 2011/0018855 A1 | 1/2011 | Miyazawa |
| 2011/0157143 A1* | 6/2011 | Choi .................... G09G 3/3233 345/212 |
| 2012/0249904 A1 | 10/2012 | Morosawa |
| 2012/0327142 A1 | 12/2012 | Kimura |
| 2013/0021316 A1 | 1/2013 | Inoue et al. |
| 2013/0201173 A1* | 8/2013 | Chaji .................... G09G 3/3233 345/212 |
| 2013/0334535 A1 | 12/2013 | Kimura |
| 2014/0085359 A1 | 3/2014 | Nathan et al. |
| 2014/0361708 A1 | 12/2014 | Nathan et al. |

FOREIGN PATENT DOCUMENTS

| | | |
|---|---|---|
| JP | 2009-187040 | 8/2009 |
| JP | 2009-204887 | 9/2009 |
| JP | 2010-139896 | 6/2010 |
| JP | 2010-139897 | 6/2010 |
| JP | 2011-520139 | 7/2011 |
| JP | 2012-212077 | 11/2012 |
| JP | 2012-247790 | 12/2012 |
| JP | 2013-137498 | 7/2013 |
| WO | 2009/127065 | 10/2009 |
| WO | 2013/015091 | 1/2013 |

* cited by examiner

DISPLAY DEVICE AND DRIVING METHOD

TECHNICAL FIELD

The present invention relates to display devices and driving methods, and relates particularly to a method of driving a display device including a current-driven light-emitting element.

BACKGROUND ART

In recent years, organic electro luminescence (EL) displays using organic EL have attracted attention as candidates for next-generation flat-panel displays to replace liquid crystal displays. An active-matrix display device, such as the organic EL display, includes a thin-film transistor (TFT) as a drive transistor.

Silicon is often used for the semiconductor layer (channel layer) of the thin-film transistor, but recently a thin-film transistor has been developed which uses an oxide semiconductor, as represented by amorphous IGZO (In—Ga—Zn—O), for the semiconductor layer (see Patent Literature (PTL) 1, for example).

CITATION LIST

Patent Literature

[PTL 1] Japanese Unexamined Patent Application Publication No. 2012-212077

SUMMARY OF INVENTION

Technical Problem

However, in such a TFT using an oxide semiconductor for a semiconductor layer (channel layer), a gate-source voltage for placing the TFT in a conductive state (threshold voltage) is easily varied by stress when powered up or the like. Such a temporal variation in the threshold voltage affects luminance control of a display device, thereby resulting in poor display quality.

Furthermore, in the TFT using the oxide semiconductor for the semiconductor layer, even when a threshold-voltage compensation operation is performed to reduce the variation in the threshold voltage, the threshold-voltage compensation operation cannot be performed for a long time because the threshold voltage is easily varied. In other words, an operable voltage range within which the threshold-voltage compensation operation can be performed (i.e. a voltage between a lower limit and an upper limit) cannot be maintained for a long time.

The present invention has been conceived in view of the foregoing disadvantages, and has an object to provide a display device capable of maintaining the threshold voltage of the drive transistor within the operable voltage range for a longer time even when it is difficult to ensure an adequate period for the threshold voltage compensation operation, and also provide a method of driving the display device.

Solution to Problem

In order to achieve the object, a display device according to an aspect of the present invention includes pixels arranged in a matrix, in which each of the pixels includes: a light emitting element; a capacitor for storing voltage; a drive transistor that provides, to the light emitting element, a current corresponding to the voltage stored in the capacitor to cause the light emitting element to emit light; a voltage supplier that applies a reference voltage to the drive transistor in an initialization period, and applies a reverse bias voltage to the drive transistor in a predetermined period before the initialization period, the reference voltage being higher than a threshold voltage of the drive transistor and providing a forward bias between a gate electrode and a source electrode of the drive transistor, the initialization period being a period for initializing the pixel, the reverse bias voltage providing a reverse bias between the gate electrode and the source electrode of the drive transistor, the predetermined period being included in a period in which the light emitting element does not emit light.

Advantageous Effects of Invention

A display device according to the present invention can maintain a threshold voltage of a drive transistor within an operable voltage range for a longer time even when it is difficult to ensure an adequate period for a threshold voltage compensation operation.

DESCRIPTION OF EMBODIMENTS

Figure 1:
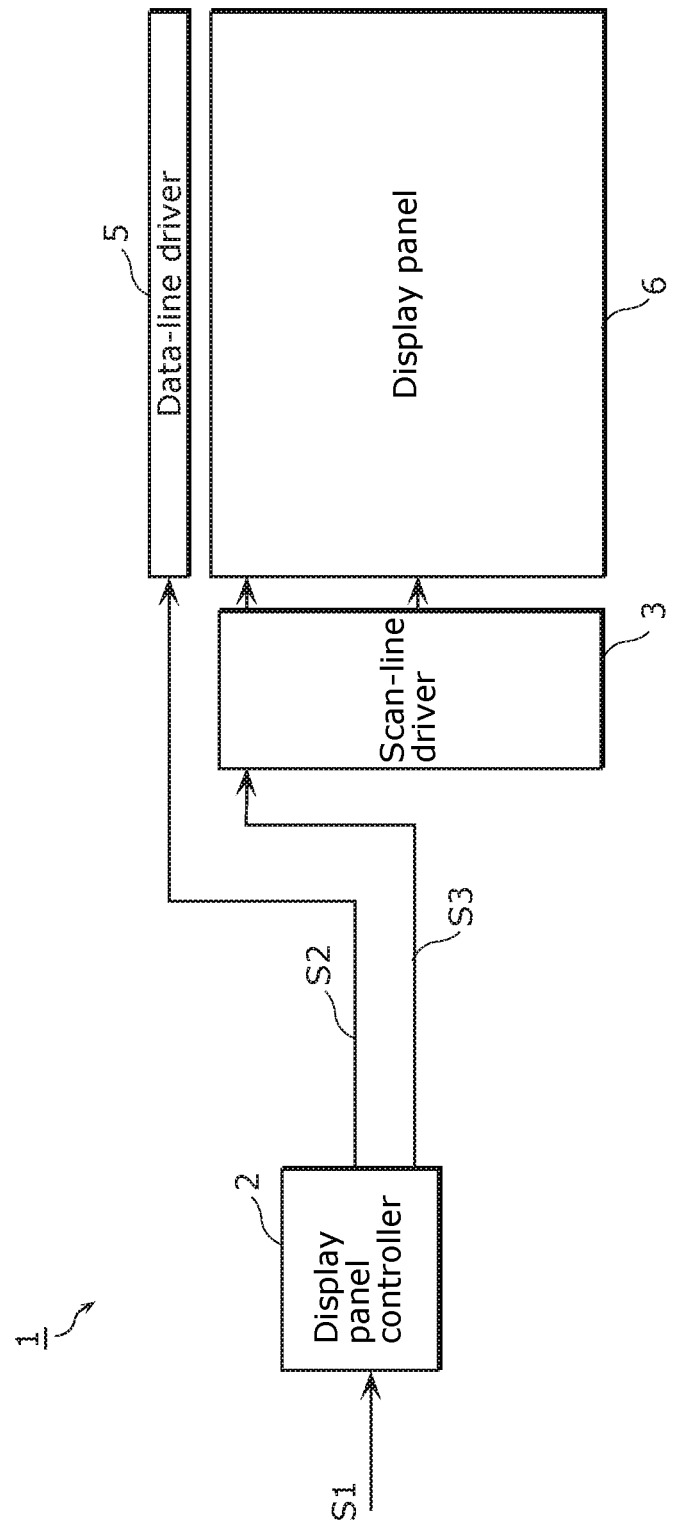
FIG. 1 is an exemplary functional block diagram of a display device according to an embodiment.

An aspect of a display device according to the present invention is a display device including: a controller; and pixels arranged in a matrix, in which each of the pixels includes: a light emitting element; a capacitor for storing voltage; a drive transistor that provides, to the light emitting element, a current corresponding to the voltage stored in the capacitor to cause the light emitting element to emit light; a voltage supplier that applies a reference voltage to the drive transistor in an initialization period, and applies a reverse bias voltage to the drive transistor in a predetermined period before the initialization period, the reference voltage being higher than a threshold voltage of the drive transistor and providing a forward bias between a gate electrode and a source electrode of the drive transistor, the initialization period being a period for initializing the pixel, the reverse bias voltage providing a reverse bias between the gate electrode and the source electrode of the drive transistor, the predetermined period being included in a period in which the light emitting element does not emit light; a first switch that electrically connects a second electrode of the capacitor and a first power line in the initialization period and in the predetermined period; a second switch that is turned ON and OFF to electrically connect and disconnect a signal line for providing a data signal voltage and a first electrode of the capacitor; and a third switch that is turned ON and OFF to electrically connect and disconnect the first electrode of the capacitor and the gate electrode of the drive transistor, the voltage supplier includes: a power selection switch that selects a second power line or a third power line to provide the reference voltage or the reverse bias voltage, the second power line providing the reference voltage, the third power line providing the reverse bias voltage; and a fourth switch that is turned ON and OFF to electrically connect and disconnect the power selection switch and the gate electrode of the drive transistor, and the source electrode of the drive transistor is electrically connected to the second electrode of the capacitor and an anode of the light emitting element, and in which the controller: in the predetermined period, maintains the fourth switch ON while maintaining the second switch OFF, the third switch ON, and the first switch ON, and selects the third power line through the power selection switch to provide the reverse bias voltage; and in the initialization period, maintains the fourth switch ON while maintaining the second switch OFF, the third switch ON, and the first switch ON, and selects the second power line through the power selection switch to provide the reference voltage.

In this display device, for example, the first switch, the second switch, the third switch, the fourth switch, and the drive transistor are each an N-channel thin film transistor.

Furthermore, for example, the predetermined period is longer than a threshold compensation period for compensating the threshold voltage of the drive transistor, the threshold compensation period being after the initialization period.

Furthermore, for example, the drive transistor has an oxide semiconductor channel layer.

Furthermore, an aspect of a driving method according to the present invention is a method of driving a display device having pixels which are arranged in a matrix and each of which includes: a light emitting element; a capacitor for storing voltage; a drive transistor that provides, to the light emitting element, a current corresponding to the voltage stored in the capacitor to cause the light emitting element to emit light; a first switch that electrically connects a second electrode of the capacitor and a first power line; a second switch that is turned ON and OFF to electrically connect and disconnect a signal line for providing a data signal voltage and a first electrode of the capacitor; and a third switch that is turned ON and OFF to electrically connect and disconnect the first electrode of the capacitor and the gate electrode of the drive transistor, the drive transistor having a source electrode electrically connected to the second electrode of the capacitor and an anode of the light emitting element, the method including: applying a reference voltage to the drive transistor in an initialization period, the reference voltage being higher than a threshold voltage of the drive transistor and providing a forward bias between a gate electrode and a source electrode of the drive transistor, the initialization period being a period for initializing the pixel; and applying a reverse bias voltage to the drive transistor in a predetermined period before the initialization period, the reverse bias voltage providing a reverse bias between the gate electrode and the source electrode of the drive transistor, the predetermined period being included in a period in which the light emitting element does not emit light, in which, in the applying of a reverse bias voltage, a fourth switch is turned ON while maintaining the second switch OFF, the third switch ON, and the first switch ON, and a third power line is selected through a power selection switch to provide the reverse bias voltage, the fourth switch being turned ON and OFF to electrically connect and disconnect to the gate electrode of the drive transistor when a second power line or the third power line is selected to provide the reference voltage or the reverse bias voltage, the second power line providing the reference voltage, the third power line providing the reverse bias voltage, and in the applying of a reference voltage, the fourth switch is turned ON while maintaining the second switch OFF, the third switch ON, and the first switch ON, and the second power line is selected through the power selection switch to provide the reference voltage.

Hereinafter, the display device according to an aspect of the present invention and the method of driving the display device are described in detail with reference to the drawings.

It should be noted that each of the exemplary embodiments described below shows a general or specific example. The numerical values, shapes, materials, structural elements, the arrangement and connection of the structural elements, steps, the processing order of the steps, etc. shown in the following exemplary embodiments are mere examples, and therefore do not limit the scope of the appended claims and their equivalents. Furthermore, among the structural elements in the following exemplary embodiments, structural elements not recited in any one of the independent claims are described as arbitrary structural elements. Furthermore, the drawings are schematic and not necessarily exact in detail.

[Embodiment]

In this embodiment, the case where an organic EL element is used as a light-emitting element of a display device according to an aspect of the present disclosure is described.

FIG. 1 is an exemplary functional block diagram of a display device according to an embodiment.

The display device 1 shown in FIG. 1 includes a display panel controller 2, a scan-line driver 3, a data-line driver 5, and a display panel 6.

For example, the display panel 6 is an organic EL panel. Furthermore, the display panel 6 includes at least N (N=1080, for example) scan lines disposed in parallel, N lighting control lines, and M source signal lines disposed orthogonal to the scan lines (not shown). The display panel 6 also includes, for each of the intersections of the source signal lines and the scan lines, a pixel circuit (not shown) including a thin-film transistor and an EL element.

The display panel controller 2 is an example of a control unit which controls a behavior in a predetermined period and an initialization period described below. The display panel controller 2 generates a control signal S2 for controlling the data-line driver 5 according to a display data signal S1, and the resultant control signal S2 is provided to the data-line driver 5. The display panel controller 2 also generates a control signal S3 for controlling the scan-line driver 3 according to an inputted synchronizing signal. Then, the display panel controller 2 provides the resultant control signal S3 to the scan-line driver 3.

The display data signal S1 is a signal representing display data and including a video signal, a vertical synchronizing signal, and a horizontal synchronizing signal. The video signal is a signal specifying, for each frame, pixel values which are gradation information. The vertical synchronizing signal is a signal for synchronizing a timing of column processing for a screen. In this embodiment, the vertical synchronizing signal is a reference signal of a timing of processing for each frame. The horizontal synchronizing signal is a signal for synchronizing a timing of row processing for the screen.

Furthermore, the control signal S2 includes the video signal and the horizontal synchronizing signal. The control signal S3 includes the vertical synchronizing signal and the horizontal synchronizing signal.

The data-line driver 5 drives the source signal line of the display panel 6 according to the control signal S2 generated in the display panel controller 2. More specifically, the data-line driver 5 provides a source signal to each pixel circuit according to the video signal and the horizontal synchronizing signal.

The scan-line driver 3 drives the scan line of the display panel 6 according to the control signal S3 generated in the display panel controller 2. More specifically, the scan-line driver 3 provides a scan signal, a Ref signal, a Merge signal, and an init signal to each pixel circuit according to the vertical synchronizing signal and the horizontal synchronizing signal.

As described above, the display device 1 is configured.

It should be noted that the display device 1 may include, for example, a CPU (Central Processing Unit), a storage medium such as a ROM (Read Only Memory) storing a control program, a working memory such as a RAM (Random Access Memory), and a communication circuit, which are not shown. For example, the display data signal S1 is generated by executing the control program through the CPU.

Figure 2A:
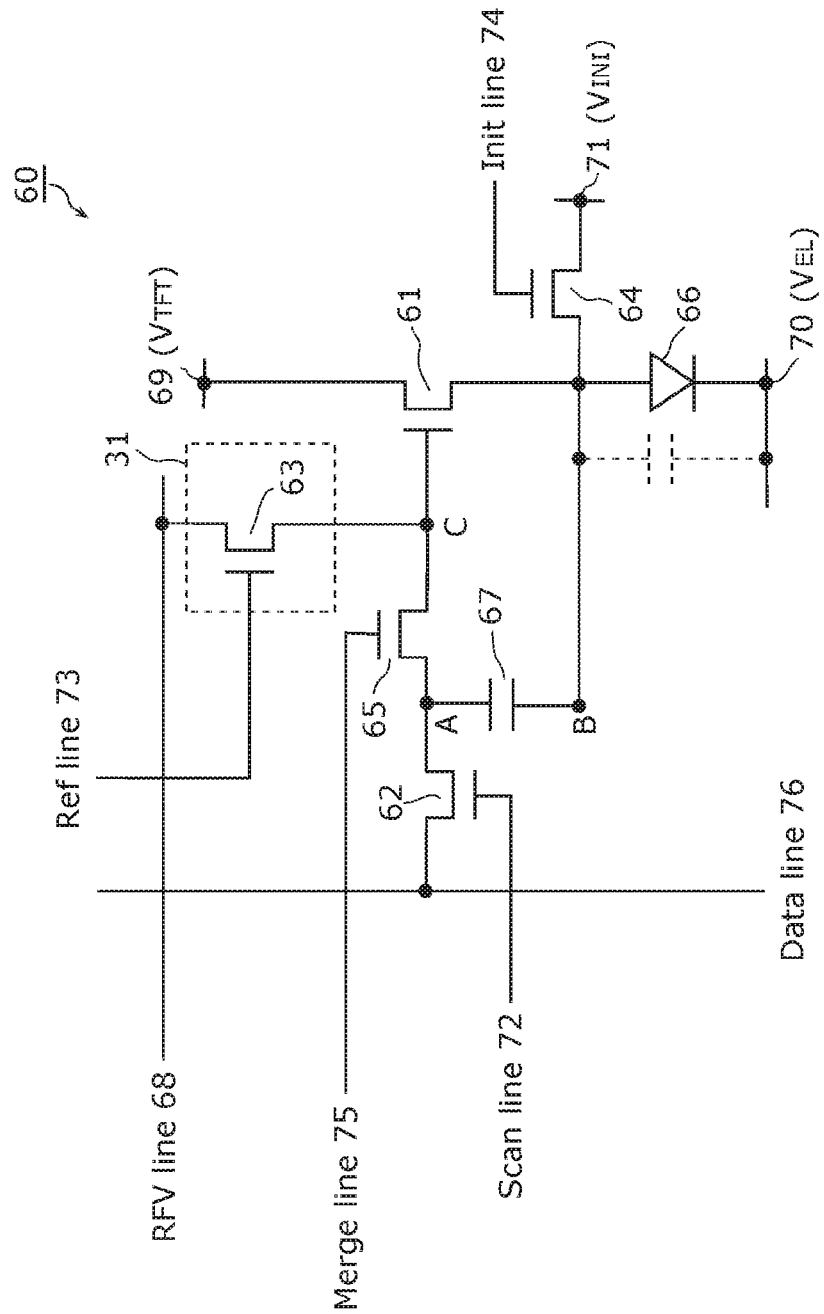
FIG. 2A is an exemplary circuit configuration of a pixel included in the display device according to the embodiment.
Figure 2B:
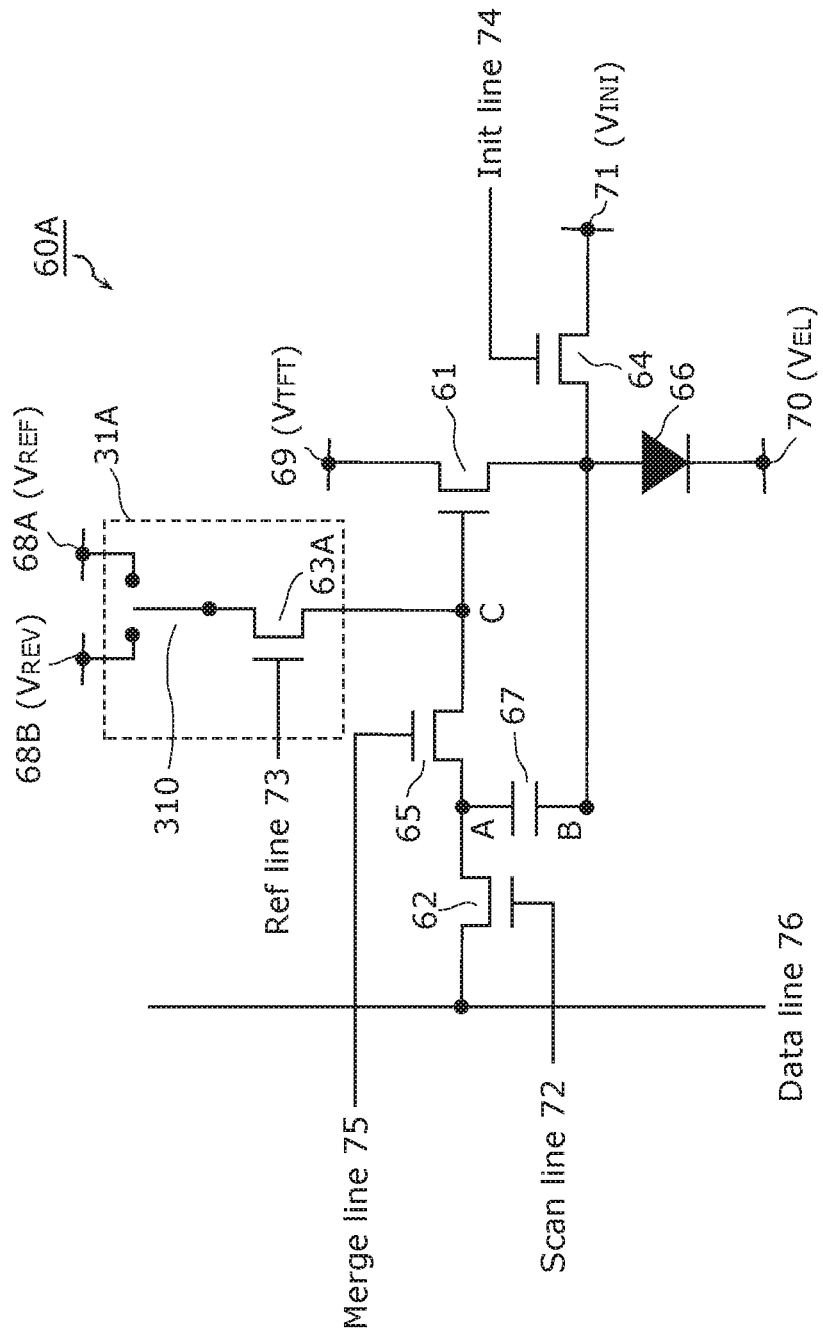
FIG. 2B is another exemplary circuit configuration of the pixel included in the display device according to the embodiment.

FIG. 2A and FIG. 2B are each an exemplary circuit configuration of a pixel included in the display device according to the embodiment.

The pixel circuit 60 shown in FIG. 2A and FIG. 2B is a pixel included in the display panel 6, and has a function of emitting light according to a data signal (data signal voltage) provided through a Data line 76 (data line).

The pixel circuit 60 is an example of the pixel (light-emitting pixel), and plural pixel circuits are disposed in a matrix. As shown in FIG. 2A, the pixel circuit 60 includes a drive transistor 61, a switch 62, a voltage supplier 31 including a switch 63, a switch 64, a switch 65, an EL element 66, and a capacitor 67, for example. The pixel circuit 60 also includes the Data line 76 (data line), a RFV line 68 ($V_{REF}$, or $V_{REV}$), an EL anode power line 69 ($V_{TFT}$), an EL cathode power line 70 ($V_{EL}$), an initialization power line 71 ($V_{INI}$), and a Merge line 75 (a merge line).

The Data line 76 is an example of a signal line (source signal line) for providing a data signal voltage.

As shown in FIG. 2A, the RFV line 68 provides a reference voltage $V_{REF}$ or a reverse bias voltage $V_{REV}$, for example. The EL anode power line 69 ($V_{TFT}$) is the high-voltage side of a power line which determines a potential of the drain electrode of the drive transistor 61, and is 20 V, for example. The EL cathode power line 70 ($V_{EL}$) is the low-voltage side of the power line which is connected to the second electrode (cathode) of the EL element 66. The initialization power line 71 ($V_{INI}$) is an example of the first power line for providing a voltage $V_{INI}$ (also referred to as an initialization voltage $V_{INI}$) to initialize a voltage between the source and gate of the drive transistor 61, i.e. a voltage of the capacitor 67.

A potential difference between the reference voltage $V_{REF}$ provided by the RFV line 68 and the voltage $V_{INI}$ of the initialization power line 71 is set to be higher than the threshold voltage (Vth) of the drive transistor 61, i.e. threshold voltage Vth <(reference voltage $V_{REF}$−voltage $V_{INI}$).

Furthermore, in order to prevent current from flowing through the EL element 66, the reference voltage $V_{REF}$ provided from the RFV line 68 and the voltage $V_{INI}$ of the initialization power line 71 are set to be:

Voltage $V_{INI}$<Voltage $V_{EL}$+(Forward threshold voltage of EL element 66), and Reference voltage $V_{REF}$<Voltage $V_{EL}$+(Forward threshold voltage of EL element 66)+(Threshold voltage Vth of drive transistor 61), respectively.

For example, as shown in FIG. 2B, the RFV line 68 may include a power line 68A ($V_{REF}$) and a power line 68B ($V_{REV}$), one of which is selected by a power selection switch 310 to provide the reference voltage $V_{REF}$ or a reverse bias voltage $V_{REV}$.

The EL element 66 is an example of the light-emitting element which emits light in accordance with a current provided from the drive transistor 61, and plural EL elements are arranged in matrix. The EL element 66 is an organic EL element, for example. The EL element 66 has a cathode (second electrode) connected to the EL cathode power line 70, and an anode (first electrode) connected to the source (source electrode) of the drive transistor 61. In this embodiment, a voltage provided to the EL cathode power line 70 is $V_{EL}$ of 0 (v), for example.

The drive transistor 61 is a voltage-driven drive transistor for controlling application of current to the EL element 66, and causes the EL element 66 to emit light by applying, to the EL element 66, a current corresponding to a voltage stored in the capacitor 67.

For example, in a light-emitting period (Period T11 described below), the drive transistor 61 causes the EL element 66 to emit light by providing, to the EL element 66, a current corresponding to a voltage stored in the capacitor 67 (data signal voltage). More specifically, the drive transistor 61 causes the EL element 66 to emit light by converting the data signal voltage provided to the gate electrode into a current corresponding thereto, and providing the resultant current to the EL element 66.

Furthermore, for example, in a non-light-emitting period following the light-emitting period (Period T12 described below), the drive transistor 61 prohibits the EL element 66 from emitting light by providing no current to the EL element 66.

Furthermore, for example, in the predetermined period before the initialization period (reverse bias period, Period T2 described below), a reverse bias is applied between the gate electrode and the source electrode of the drive transistor 61. In this way, it is possible to reduce the amount of variation in the threshold voltage Vth. After this, in the initialization period (Period T5 described below), a voltage required to flow the drain current to perform the threshold-voltage compensation of the drive transistor 61 is applied between the source electrode and the gate electrode of the drive transistor 61, and in a threshold compensation period (Period T6 described below), the threshold voltage of the drive transistor 61 is compensated. Put briefly, as described above, the display device is provided with, in addition to the threshold compensation function for compensating the variation in the threshold voltage Vth, a reverse-bias application function for reducing the amount of variation in the threshold voltage Vth, and thus the drive transistor 61 (pixel circuit 60) can have the threshold voltage Vth maintained within an operable voltage range for a longer time. The details are described below.

Furthermore, a thin-film transistor (TFT) forming the drive transistor 61 may be an n-type transistor or a p-type transistor. Furthermore, the channel layer of the thin-film transistor may be formed of any of the materials such as amorphous silicon, microcrystal silicon, polysilicon, an oxide semiconductor, and an organic semiconductor. For example, the oxide semiconductor can include an oxide semiconductor material containing at least one of indium (in), gallium (Ga), and zinc (Zn). The oxide semiconductor has low off-current and high electron mobility even in an amorphous state, and can be formed in low-temperature process and using amorphous indium-gallium-zinc oxide (InGaZnO), for example.

The capacitor 67 is a storage capacitor for storing voltage, and stores a voltage determining the amount of current provided from the drive transistor 61. More specifically, the second electrode of the capacitor 67 (node-B-side electrode) is connected between the source electrode of the drive transistor 61 (EL cathode power line 70 side) and the anode (first electrode) of the EL element 66. The first electrode of the capacitor 67 (node-A-side electrode) is connected to the gate electrode of the drive transistor 61 via the switch 65. The first electrode of the capacitor 67 is also connected to the RFV line 68 for providing the reference voltage $V_{REF}$ or the reverse bias voltage $V_{REV}$, via the switches 63 and 65.

The switch 62 is an example of the second switch that is turned ON and OFF to electrically connect and disconnect the Data line 76 (signal line) for providing a data signal voltage and the first electrode of the capacitor 67. More specifically, the switch 62 has the drain and the source one of which is connected to the Data line 76 and the other of which is connected to the first electrode of the capacitor 67, and the gate connected to the Scan line 72 which is a scan line. In other words, the switch 62 has a function for writing, in the capacitor 67, a data signal voltage (a data signal) corresponding to a video signal voltage (a video signal) provided through the Data line 76.

The voltage supplier 31 applies the reference voltage $V_{REF}$, which is higher than the threshold voltage Vth of the drive transistor 61 and provides a forward bias between the gate electrode and the source electrode of the drive transistor 61, to the drive transistor 61 in the initialization period (period T5) for initializing the drive transistor 61. The voltage supplier 31 applies the reverse bias voltage, which provides a reverse bias between the gate electrode and the source electrode of the drive transistor 61, to the drive transistor 61 in the predetermined period (period T2) before the initialization period (period T5). More specifically, in the predetermined period (Period T2), the voltage supplier 31 applies the reverse bias voltage to the gate electrode of the drive transistor 61 with reference to the initialization power line 71 (the first power line). In the initialization period (Period T5), the voltage supplier 31 applies the reference voltage $V_{REF}$ to the gate electrode of the drive transistor 61 with reference to the initialization power line 71 (the first power line).

In this embodiment, as shown in FIG. 2A, the voltage supplier 31 has a switch 63, for example.

The switch 63 is an example of the fourth switch that is turned ON and OFF to electrically connect and disconnect between the RFV line 68 for providing the reference voltage $V_{REF}$ or the reverse bias voltage $V_{REV}$ and the gate electrode of the drive transistor 61 and between the RFV line 68 and one of the drain and source of the switch 65. More specifically, as shown in FIG. 2A, the switch 63 is a switching transistor having the drain and the source one of which is connected to the RFV line 68 and the other of which is connected to the gate electrode of the drive transistor 61 and the one of the drain and source of the switch 65, and the gate connected to the Ref line 73. In other words, the switch 63 has a function of providing the reference voltage $V_{REF}$ or the reverse bias voltage $V_{REV}$ to the gate electrode of the drive transistor 61.

It should be noted that the voltage supplier 31 is not limited to the configuration shown in FIG. 2A. As shown in FIG. 2B, when the RFV line 68 is formed of the power line 68A ($V_{REF}$) and the power line 68B ($V_{REV}$), the voltage supplier 31A may include a switch 63A and a power selection switch 310.

In this embodiment, as shown in FIG. 23, the power selection switch 310 selects the power line 68A for providing the reference voltage $V_{REF}$ (second power line) or the power line 683 for providing the reverse bias voltage $V_{REV}$ (third power line) to provide the reference voltage $V_{REF}$ or the reverse bias voltage $V_{REV}$. For example, the switch 63A is an example of the fourth switch which is turned ON and OFF to electrically connect and disconnect the power selection switch 310 and the gate electrode of the drive transistor 61. The switch 63A is the same as the switch 63 except the relation of connection with the power line 68A ($V_{REF}$) and the power line 683 ($V_{REV}$), and thus is not further described here.

The switch 64 is an example of the first switch which is turned ON and OFF to electrically connect and disconnect between the second electrode of the capacitor 67 and the initialization power line 71 (the first power line) and between the source electrode of the drive transistor 61 and the initialization power line 71. More specifically, the switch 64 is a switching transistor having the drain and the source one of which is connected to the initialization power line 71 ($V_{INI}$) and the other of which is connected to the second electrode of the capacitor 67 and the source electrode of the drive transistor 61, and the gate connected to the Init line 74. In other words, the switch 64 has a function of providing the initialization voltage $V_{INI}$ to the second electrode of the capacitor 67 and the source electrode of the drive transistor 61.

The switch 65 is an example of the third switch that is turned ON and OFF to electrically connect and disconnect the first electrode of the capacitor 67 and the gate electrode of the drive transistor 61. More specifically, the switch 65 is a switching transistor having the drain and the source one of which is connected to the other of the drain and source of the switch 63 and the gate electrode of the drive transistor 61 and the other of which is connected to the first electrode of the capacitor 67, and the gate connected to the Merge line 75. In other words, the switch 65 has a function of providing the potential of the first electrode of the capacitor 67 to the gate electrode of the drive transistor 61.

As described above, the pixel circuit 60 is configured.

It should be noted that the switches 62 to 65 included in the pixel circuit 60 are described as n-type TFTs in the following sections, but are not limited to those. The switches 62 to 65 may be p-type TFTs, or a combination of both. In other words, for example, only the drive transistor 61 is a p-type TFT and the other switches 62 to 65 may be n-type TFTs. Alternatively, only the switch 63 is a p-type TFT and the drive transistor 61 and the switches 62, 64, and 65 may be n-type TFTs.

Next, a method of driving the pixel circuit shown in FIG. 2A is described with reference to FIG. 3 to FIG. 4F.

Figure 3:
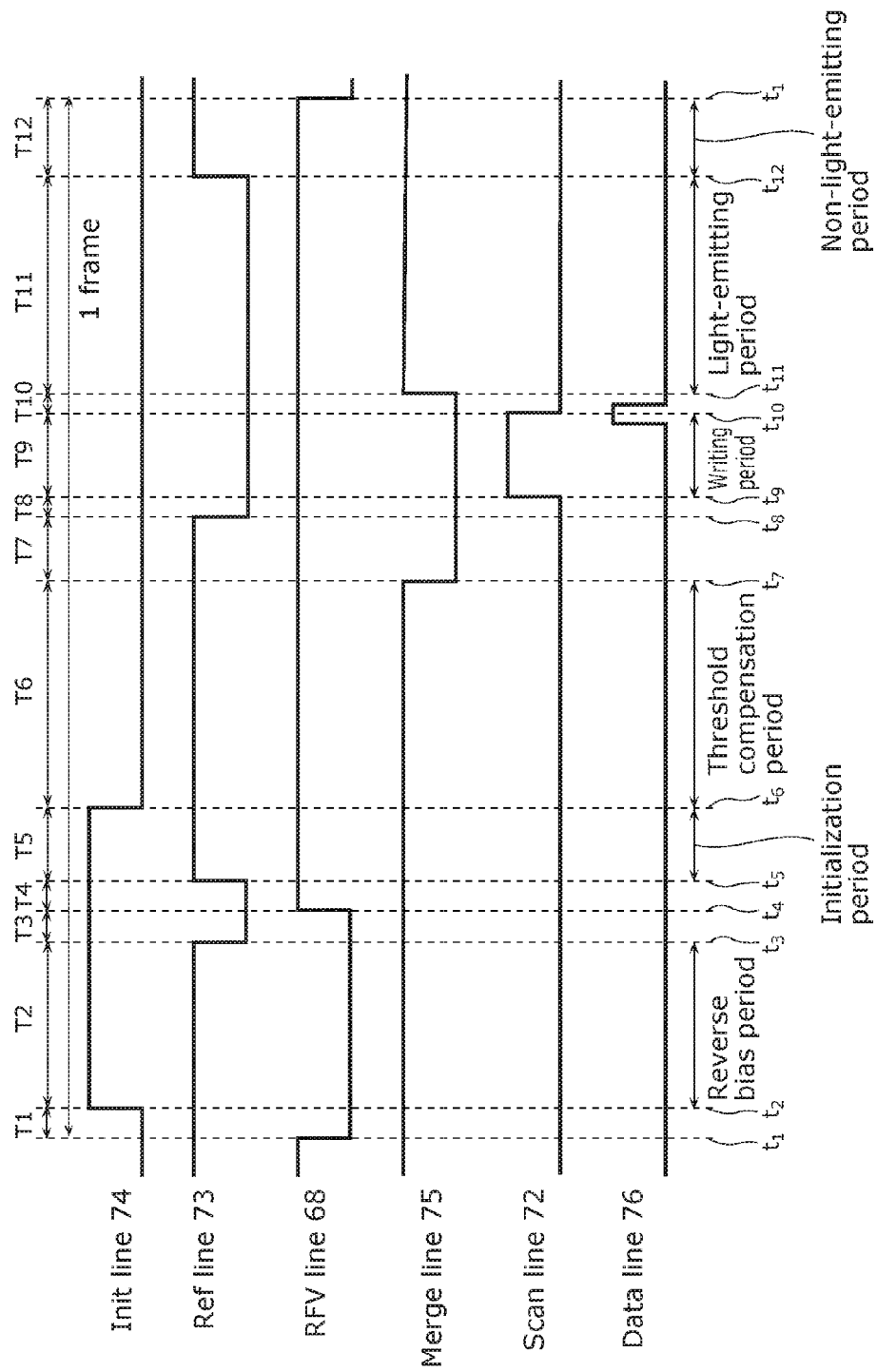
FIG. 3 is a timing chart for describing an exemplary behavior of the display device according to the embodiment.

FIG. 3 is a timing chart for describing an exemplary behavior of the display device according to the embodiment. FIG. 4A to FIG. 4F are each an exemplary behavior of the pixel circuit in the timing chart of FIG. 3. In FIG. 3, the x-axis represents time. In the x-axis direction, the waveforms of voltages of the Scan line 72, the Ref line 73, the Init line 74, the Merge line 75, and the Data line 76 for pixel circuits 60 belonging to one of N lines in the display panel 6 are shown. It is assumed here that the RFV line 68 provides the reference voltage $V_{REF}$ when a voltage level is HIGH, and provides the reverse bias voltage $V_{REV}$ when the voltage level is LOW.

With the configuration of the pixel circuit 60 shown in FIG. 2A, a driving method (scanning method) according to the embodiment can be achieved by conducting the periods T1 to T12 according to the control of the display panel controller 2.

The exemplary behavior of the pixel circuit 60 is described in detail in the following sections.

<Period T1>

The period T1 between time t1 and time t2 in FIG. 3 is a transition period for switching voltage provided from the RFV line.

More specifically, at time t1, the scan-line driver 3 switches the voltage provided from the RFV line 68 from the reference voltage $V_{REF}$ to the reverse bias voltage $V_{REV}$ while maintaining the voltage levels of the Scan line 72 and the Init line 74 at a LOW level, and the voltage levels of the Ref line 73 and the Merge line 75 at a HIGH level. In other words, at time t1, the voltage provided to the RFV line 68 is switched from the reference voltage $V_{REF}$ to the reverse bias voltage $V_{REV}$ while the switch 62 and the switch 64 are maintained in a non-conductive state (OFF) and the switch 63 and the switch 65 are maintained in a conductive state (ON).

Thus, the period T1 is provided which is a transition period for switching the voltage provided from the RFV line. Accordingly, it is possible to prevent flow-through current from flowing between the EL anode power line 69 and the initialization power line 71.

When the display panel 6 included in the display device 1 or a pixel (pixel circuit 60) is large in size, the time constants of the gate signal lines (the Scan line 72 to the Merge line 75) become large. For this reason, the rate of change in the signal voltage for each of the gate signal lines is significantly varied in the plane of the display panel 6. When the time constants of the gate signal lines are different from each other, even in the same pixel, their timings of switching may be different. For example, the voltage level of the Init line 74 may change to a HIGH level before the RFV line 68 changes to a "LOW" level, i.e. the voltage provided from the RFV line 68 is switched to the reverse bias voltage $V_{REV}$, and thus a large Vgs is applied to the drive transistor 61. Accordingly, flow-through current may flow from the EL anode power line 69 to the initialization power line 71. The flow-through current affects the power consumption of the display panel 6, and the power consumption increases.

Furthermore, for example, when electrical current flows through the initialization power line 71, the voltage of the initialization power line 71, which is far from the terminal of a power supply, is increased, and thus the voltage applied in the initialization period becomes higher than the predetermined voltage.

Accordingly, the voltage Vgs at the beginning of the threshold compensation period is insufficient, thereby resulting in a narrow operable range of Vth.

For this reason, the period T1 is provided which is a transition period for switching the voltage provided to the RFV line 68 from the reference voltage $V_{REF}$ to the reverse bias voltage $V_{REV}$ while maintaining the switch 64 in a non-conductive state, thereby preventing flow-through current from flowing between the EL anode power line 69 and the initialization power line 71. Further considering the period T2, this method is advantageous in that the potential of the node B can be set by the voltage $V_{INI}$ of the initialization power line 71 (the initialization voltage $V_{INI}$ is written) in a short time because the potential of the node C has been set in the period T1 and only the node B is to be charged in the period T2.

<Period T2: Reverse Bias Period>

The period T2 between time t2 and time t3 in FIG. 3 is a reverse bias period for applying the reverse bias voltage $V_{REV}$ to the drive transistor 61. In this embodiment, the reverse bias voltage $V_{REV}$ means a voltage providing a reverse bias between the gate electrode and the source electrode of the drive transistor 61 when the voltage $V_{INI}$ of the initialization power line 71 is applied to the source electrode of the drive transistor 61. In this embodiment, as described above, "Reverse bias voltage $V_{REV}$−Initialization voltage $V_{INI}$<Threshold voltage Vth" is satisfied, and the Vgs of the drive transistor 61 becomes lower than or equal to the threshold voltage Vth.

Figure 4A:
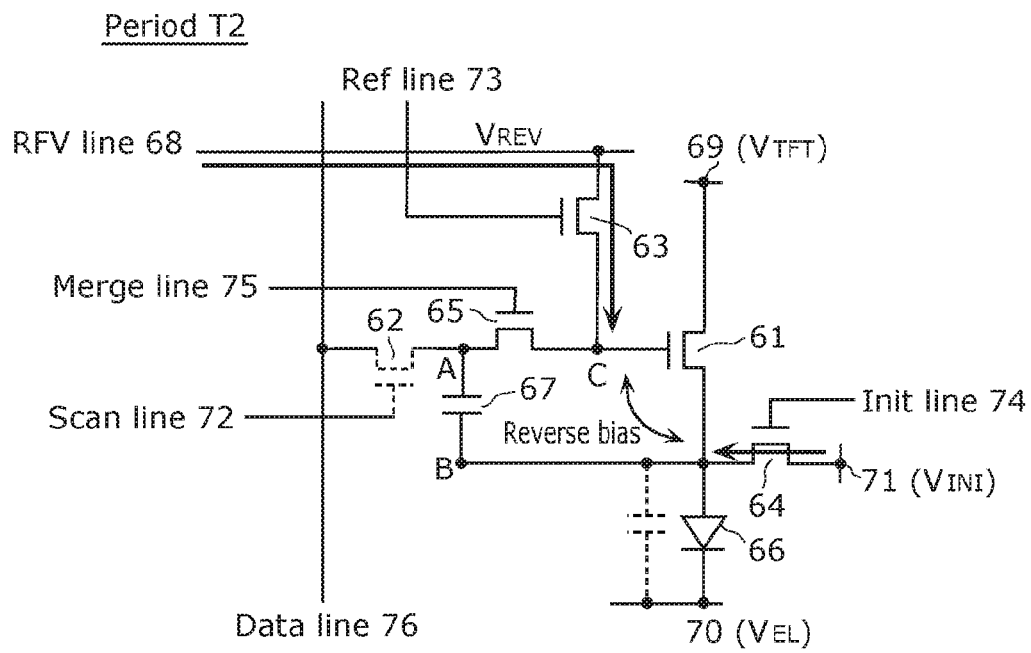
FIG. 4A is a diagram showing an exemplary behavior of a pixel circuit in the timing chart of FIG. 3.

More specifically, as shown in the behavior of the pixel circuit 60 of FIG. 4A, at the time t2, the scan-line driver 3 changes the voltage level of the Init line 74 from a LOW level to a HIGH level while maintaining the voltage level of the Scan line 72 at a LOW level, the voltage levels of the Ref line 73 and the Merge line 75 at a HIGH level, and the voltage provided from the RFV line 68 at the reverse bias voltage $V_{REV}$. In other words, at the time t2, the switch 64 is switched to a conductive state (turned ON) while the switch 62 is maintained in a non-conductive state (OFF), the switch 63 and the switch 65 are maintained in a conductive state (ON), and the voltage provided from the RFV line 68 is maintained at the reverse bias voltage $V_{REV}$.

Thus, the period T2 is provided which is a reverse bias period for providing a reverse bias between the gate electrode and the source electrode of the drive transistor 61. Accordingly, it is possible to reduce the amount of variation in the threshold voltage Vth of the drive transistor 61. Furthermore, the threshold voltage shifted in the light-emitting period (period T11) can be shifted in an opposite direction to reduce the variation in the threshold voltage before and after a frame.

It should be noted that the amplitude of reverse bias voltage to be applied or an amount of shift in the threshold voltage in the light-emitting period (period T11) is used to set the period T2 so as to reduce the variation in the threshold voltage before and after a frame. For example, when a forward bias voltage of 4V is applied during 70% of the length of a frame, a reverse bias period with a reverse bias voltage of −10V is conducted for about 20% of the length of a frame.

Furthermore, in this embodiment, the capacitor 67 is a semiconductor capacitor, and the voltage level of the Merge line 75 is maintained at a HIGH level (the switch 65 is ON) in the period T2 (reverse bias period) to match the degradation properties between the drive transistor 61 and the capacitor 67. However, any other cases are possible. When the capacitor 67 has a MIM (Metal-Insulator-Metal) structure, the voltage level of the Merge line 75 may be a LOW level (the switch 65 is OFF).

<Period T3>

The period T3 between time t3 and time t4 in FIG. 3 is a predetermined period for turning OFF the switch 63 to switch the voltage provided from the RFV line.

The display panel controller 2 switches the switch 63 to a non-conductive state (turns OFF the switch 63) while maintaining the switch 62 in a non-conductive state (OFF), the switch 65 in a conductive state (ON), and the switch 64 in a conductive state (ON), and provides the reverse bias voltage $V_{REV}$ from the RFV line 68 to the gate electrode of the drive transistor 61, thereby conducting the period T3 (predetermined period).

More specifically, at the time t3, the scan-line driver 3 changes the voltage level of the Ref line 73 from a HIGH level to a LOW level while maintaining the voltage level of the Scan line 72 at a LOW level, the voltage levels of the Init line 74 and the Merge line 75 at a HIGH level, and the voltage provided from the RFV line 68 at the reverse bias voltage $V_{REV}$. In other words, at the time t3, the switch 63 is switched to a non-conductive state (turned OFF) while the switch 62 is maintained in a non-conductive state (OFF), the switch 64 and the switch 65 are maintained in a conductive state (ON), and the voltage provided from the RFV line 68 is maintained at the reverse bias voltage $V_{REV}$.

Thus, the period T3 for turning OFF the switch 63 is provided. Accordingly, it is possible to prevent flow-through current from flowing between the EL anode power line 69 and the initialization power line 71 due to application of the reference voltage $V_{REF}$ to the gate electrode of the drive transistor 61 at a time when the voltage provided from the RFV line is switched. It should be noted that, if the period T3 does not exist, in a pixel where the voltage of the RFV line 68 quickly rises up to a HIGH level, flow-through current flows between the EL anode power line 69 and the initialization power line 71 at an early stage. On the other hand, for the initialization, the pixel is needed to raise voltage up to the reference voltage $V_{REF}$, and thus a term prior to the initialization period (period T5), i.e. the term corresponding to the periods T3 and T4, is lengthened. This increases the ratio of flow-through current to current for emitting light in view of the number of pixels and time, thereby increasing the power consumption of the panel regardless of light emission.

<Period T4>

The period T4 between time t4 and time t5 in FIG. 3 is a transition period for switching the voltage provided from the RFV line.

More specifically, at time t4, the scan-line driver 3 switches the voltage provided from the RFV line 68 from the reverse bias voltage $V_{REV}$ to the reference voltage $V_{REF}$ while maintaining the voltage levels of the Scan line 72 and the Ref line 73 at a LOW level and the voltage levels of the Init line 74 and the Merge line 75 at a HIGH level. In other words, at time t4, the voltage provided to the RFV line 68 is switched from the reverse bias voltage $V_{REV}$ to the reference voltage $V_{REF}$ while the switch 62 and the switch 63 are maintained in a non-conductive state (OFF) and the switch 64 and the switch 65 are maintained in a conductive state (ON).

At this time, the change in (rising up) the voltage level of the Ref line 73 is done earlier than the switching of the voltage provided from the RFV line 68, and thus the switching of the voltage provided from the RFV line 68 and the change in the voltage level of the Ref line 73 are not conducted simultaneously, and the switching of the voltage provided from the RFV line 68 is conducted first.

Thus, the period T4 which is a transition period is provided to firstly switch the voltage provided from the RFV line. Accordingly, it is possible to prevent an unstable voltage from being applied to the gate electrode of the drive transistor 61 when the voltage provided from the RFV line is switched.

<Period T5: Initialization Period>

The period T5 between time t5 and time t6 in FIG. 3 is an initialization period for initializing the drive transistor. The initialization period means a period for applying, between the source electrode and the gate electrode of the drive transistor 61, a voltage necessary to generate a drain current to perform the threshold voltage compensation of the drive transistor 61. In this embodiment, the reference voltage $V_{REF}$, which is higher than the threshold voltage Vth of the drive transistor 61 and provides a forward bias between the gate electrode and the source electrode of the drive transistor 61, is applied to the gate electrode of the drive transistor 61.

The display panel controller 2 switches the switch 63 to a conductive state (turns ON the switch 63) while maintaining the switch 62 in a non-conductive state (OFF), the switch 65 in a conductive state (ON), and the switch 64 in a conductive state (ON), and provides the reference voltage $V_{REF}$ from the RFV line 68 to the gate electrode of the drive transistor 61, thereby conducting the period T5 (initialization period).

Figure 4B:
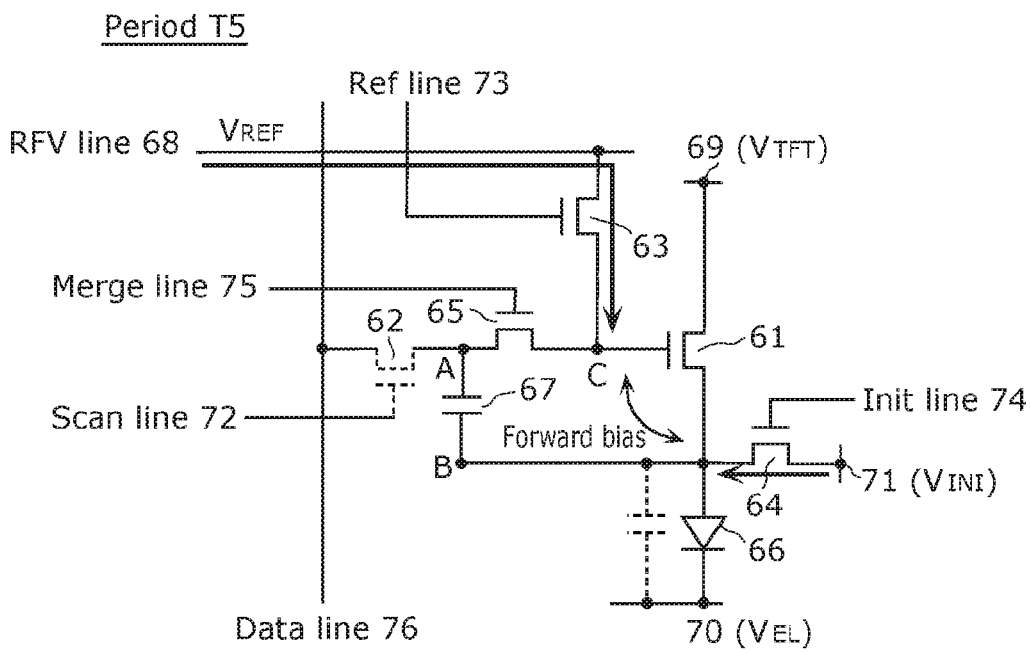
FIG. 4B is a diagram showing another exemplary behavior of the pixel circuit in the timing chart of FIG. 3.

More specifically, as shown in the behavior of the pixel circuit 60 of FIG. 4B, at the time t5, the scan-line driver 3 changes the voltage level of the Ref line 73 from a LOW level to a HIGH level while maintaining the voltage level of the Scan line 72 at a LOW level, the voltage levels of the Init line 74 and the Merge line 75 at a HIGH level, and the voltage provided from the RFV line 68 at the reference voltage $V_{REF}$. In other words, at the time t5, the switch 63 is switched to a conductive state (turned ON) while the switch 62 is maintained in a non-conductive state (OFF), the switch 64 and the switch 65 are maintained in a conductive state (ON), and the voltage provided from the RFV line 68 is maintained at the reference voltage $V_{REF}$.

Thus, the initialization period is started by changing (raising up) the voltage level of the Ref line 73 from a LOW level to a HIGH level.

In this way, the potential of the node A (node C) is set to the reference voltage $V_{REF}$ provided from the RFV line 68. Furthermore, the potential of the node B is set to the voltage $V_{INI}$ of the initialization power line 71 because the switch 64 is in a conductive state (ON). In other words, the initialization period for applying a predetermined voltage of a forward bias between the gate electrode and the source electrode of the drive transistor 61 is conducted by applying, to the gate electrode of the drive transistor 61, the reference voltage $V_{REF}$ provided from the RFV line 68, and applying, to the source electrode of the drive transistor 61, the voltage $V_{INI}$ of the initialization power line 71.

It should be noted that the period T5 is set to a time length (time) during which the potentials of the node A (node C) and the node B reach the respective predetermined potentials.

Furthermore, the voltage (predetermined voltage) between the gate electrode and the source electrode of the drive transistor 61 is required to be set to a voltage ensuring a drain current necessary to perform the threshold voltage compensation. For this reason, a potential difference between the reference voltage $V_{REF}$ of the RFV line 68 and the voltage $V_{INI}$ of the initialization power line 71 is set to a voltage higher than the threshold voltage Vth of the drive transistor 61, i.e. "Threshold voltage Vth <(Reference voltage $V_{REF}$–Initialization voltage $V_{INI}$)", as described above. Furthermore, in order to prohibit current from flowing through the EL element 66, the initialization voltage $V_{INI}$ and the reference voltage $V_{REF}$ are set to be "Voltage $V_{INI}$<Voltage $V_{EL}$+(Forward threshold voltage of EL element 66)", and "Reference voltage $V_{REF}$<Voltage $V_{EL}$+ (Forward threshold voltage of EL element 66)+Threshold voltage Vth", respectively.

<Period T6: Threshold Compensation Period>

Next, the period T6 between time t6 and time t7 in FIG. 3 is a threshold compensation period for compensating the threshold voltage Vth of the drive transistor 61.

Figure 4C:
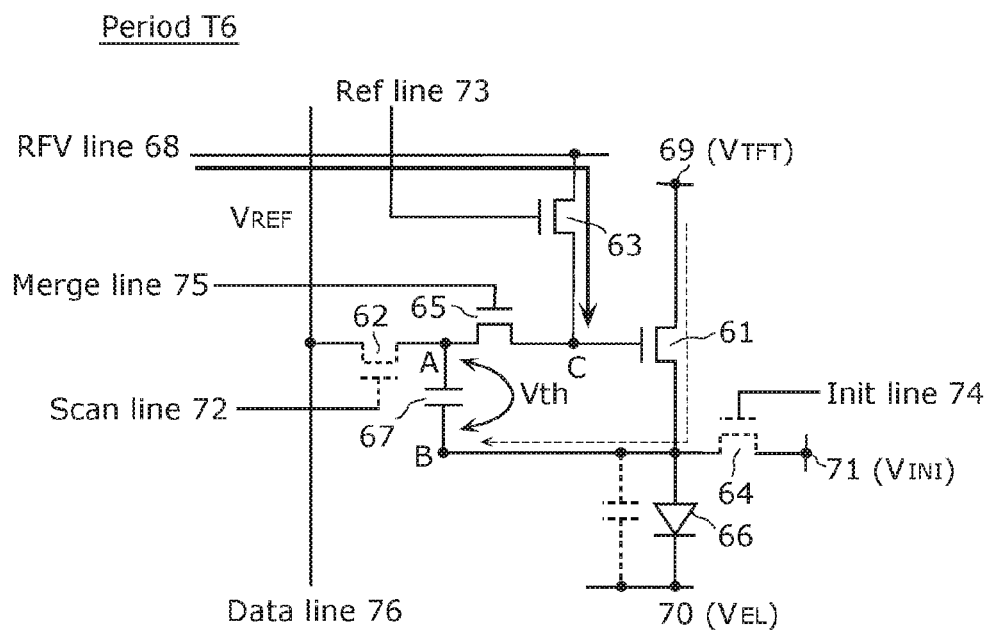
FIG. 4C is a diagram showing another exemplary behavior of the pixel circuit in the timing chart of FIG. 3.

More specifically, as shown in the behavior of the pixel circuit 60 of FIG. 4C, at the time t6, the scan-line driver 3 changes the voltage level of the Init line 74 from a HIGH level to a LOW level while maintaining the voltage level of the Scan line 72 at a LOW level, the voltage levels of the Ref line 73 and the Merge line 75 at a HIGH level, and the voltage provided from the RFV line 68 at the reference voltage $V_{REF}$. In other words, at the time t6, the switch 64 is switched to a non-conductive state (turned OFF) while the switch 62 is maintained in a non-conductive state (OFF), the switch 63 and the switch 65 are maintained in a conductive state (ON), and the voltage provided from the RFV line 68 is maintained at the reference voltage $V_{REF}$.

At this time, the voltage (predetermined voltage) between the gate electrode and the source electrode of the drive transistor 61 is set in the initialization period (period T5) as described above, and thus current does not flow through the EL element 66. The drive transistor 61 is provided with a drain current by the voltage $V_{TFT}$ of the EL anode power line 69, and the source potential of the drive transistor 61 varies depending on the drain current. In other words, the source potential of the drive transistor 61 is changed to a potential in which the drain current provided by the voltage $V_{TFT}$ of the EL anode power line 69 becomes zero.

In this way, the voltage level of the Init line 74 is changed from the HIGH level to the LOW level (the switch 65 is switched to a conductive state (turned ON)) while the reference voltage $V_{REF}$ provided from the RFV line 68 is applied to the gate electrode of the drive transistor 61, thereby starting the threshold compensation operation of the drive transistor 61.

Then, at the end of the period T6 (time t7), the voltage between the gate electrode and the source electrode of the drive transistor 61 (a potential difference between the node A (node C) and the node B) becomes a potential difference corresponding to the threshold voltage of the drive transistor 61. This potential difference (voltage) is stored (held) in the capacitor 67.

<Period T7>

The period T7 between time t7 and time t8 in FIG. 3 is a period for terminating the threshold compensation operation.

More specifically, at the time t7, the scan-line driver 3 changes the voltage level of the Merge line 75 from a HIGH level to a LOW level while maintaining the voltage levels of the Scan line 72 and the Init line 74 at a LOW level, the Ref line 73 at a HIGH level, and the voltage provided from the RFV line 68 at the reference voltage $V_{REF}$. In other words, at the time t7, the switch 65 is switched to a non-conductive state (turned OFF) while the switch 62 and the switch 64 are maintained in a non-conductive state (OFF), the switch 63 is maintained in a conductive state (ON), and the voltage provided from the RFV line 68 is maintained at the reference voltage $V_{REF}$.

Thus, the period T7 is provided in which the switch 65 is turned OFF by firstly changing the voltage level of the Merge line 75, instead of changing the voltage levels of the Ref line 73 and the Merge line 75 simultaneously. This reduces punch-through voltage, which means that a change in voltages of the gate signal lines (Scan line 72 to Merge line 75) affects the potential of the node A through the parasitic capacitances of the switch 63 and the switch 65, and thus it is possible to improve the display unevenness caused by variation in punch-through voltage.

It should be noted that when the voltage levels of the Ref line 73 and the Merge line 75 are simultaneously switched to a LOW level or the voltage level of the Ref line 73 is firstly switched to a LOW level, punch-through voltage by the switch 63 propagates to the node A first. When the switch 65 is turned ON, punch-through voltage by the switch 65 propagates to the node A next.

On the other hand, when the period T7 is provided, the punch-through voltage by the switch 65 propagates to the node A, whereas the punch-through voltage by the switch 63 does not propagate to the node A because the switch 65 is already off. Accordingly, the punch-through voltage decreases by this non-propagated amount, thereby obtaining the effect of reduction.

<Period T8>

The period T8 between time t8 and time t9 in FIG. 3 is a period for switching the switch 63 to a non-conductive state (turning OFF the switch 63) to prevent a data signal voltage provided through the Data line 76 and the reference voltage $V_{REF}$ of the RFV line 68 from being simultaneously applied to the node A.

More specifically, at the time t8, the scan-line driver 3 changes the voltage level of the Ref line 73 from a HIGH level to a LOW level while maintaining the voltage levels of the Scan line 72, the Init line 74, and the Merge line 75 at a LOW level, and the voltage provided from the RFV line 68 at the reference voltage $V_{REF}$. In other words, at the time t8, the switch 63 is switched to a non-conductive state (turned OFF) while the switch 62, the switch 64, and the switch 65 are maintained in a non-conductive state (OFF) and the voltage provided from the RFV line 68 is maintained at the reference voltage $V_{REF}$.

Thus, the period T8 is provided in which the switch 63 is further switched to a non-conductive state (turning OFF the switch 63) through the Ref line 73 to place the switch 62 and the switch 63 into a non-conductive state (OFF), thereby preventing the data signal voltage provided from the switch 62 through the Data line 76 and the reference voltage $V_{REF}$ of the RFV line 68 from being simultaneously applied to the node A (the first electrode of the capacitor 67).

It should be noted that the switch 63 and the switch 65 may be simultaneously switched to the non-conductive state (turned OFF), and the period T7 and the period T8 may be integrated.

Furthermore, in order to exactly reflect the potential difference of "Video signal voltage–Reference voltage $V_{REF}$", the period T8 is shortened as much as possible, for example.

<Period T9: Writing Period>

Next, the period T9 between time t9 and time t10 in FIG. 3 is a writing period for capturing the video signal voltage (data signal voltage) according to image gradation from the Data line 76 to the pixel circuit 60 through the switch 62, and writing it in the capacitor 67.

Figure 4D:
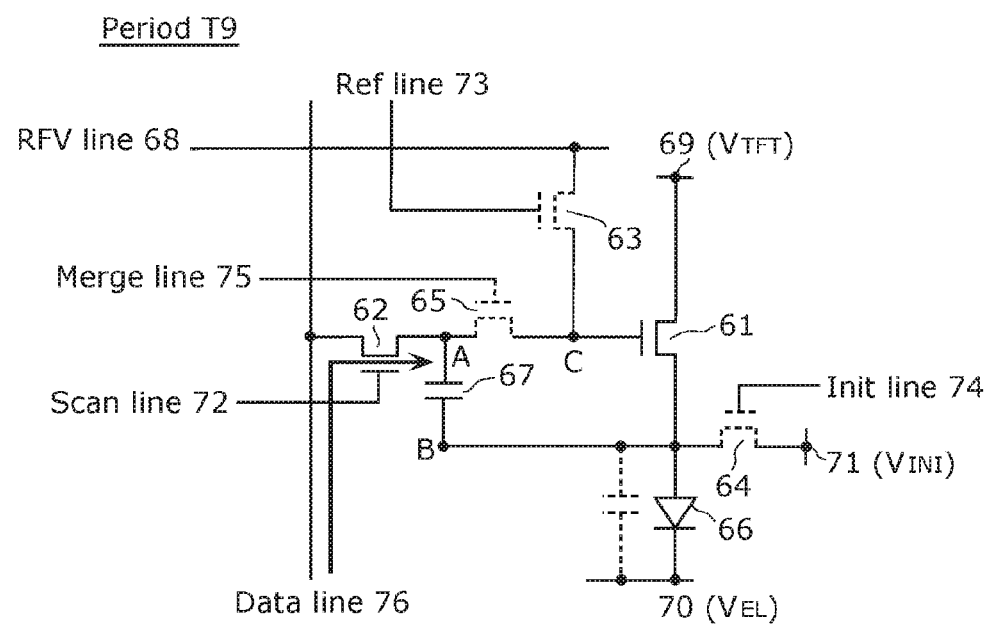
FIG. 4D is a diagram showing another exemplary behavior of the pixel circuit in the timing chart of FIG. 3.

More specifically, as shown in the behavior of the pixel circuit 60 of FIG. 4D, at the time t9, the scan-line driver 3 changes the voltage level of the Scan line 72 from a LOW level to a HIGH level while maintaining the voltage levels of the Ref line 73, the Init line 74, and the Merge line 75 at a LOW level, and the voltage provided from the RFV line 68 at the reference voltage $V_{REF}$. In other words, at the time t9, the switch 62 is switched to a conductive state (turned ON) while the switch 63, the switch 64, and the switch 65 are maintained in a non-conductive state (OFF), and the voltage provided from the RFV line 68 is maintained at the reference voltage $V_{REF}$.

In this way, the capacitor 67 stores (holds) the video signal voltage as well as the threshold voltage Vth of the drive transistor 61 stored in the threshold compensation period (period T6).

It should be noted that a frame frequency for driving the pixel circuit 60 is increasing with an increase in screen size (the display panel 6 increases in size) and an increase in the number of pixel circuits 60. Although the time constant of the Scan line 72 increases with an increase in screen size, it becomes difficult to write the predetermined gradation voltage in the pixel circuit 60 due to a shortened horizontal scan period. In view of this, in the present embodiment, even if the waveform of the Scan line 72 is rounded, the Scan line 72 rises up before the predetermined video signal (data signal voltage) is provided to the Data line 76. Thus, the switch 62 is switched to a conductive state (turned ON).

In this way, it is possible to exactly write the voltage even if the display panel 6 includes the Scan line 72 with a large load (time constant), a large screen in which it takes a long time to rise up, and a large number of pixels.

<Period T10>

The period T10 between time t10 and time t11 in FIG. 3 is a period for ensuring that the switch 62 is switched to a non-conductive state (turned OFF).

More specifically, at the time t10, the scan-line driver 3 changes the voltage level of the Scan line 72 from a HIGH level to a LOW level while maintaining the voltage levels of the Ref line 73, the Init line 74, and the Merge line 75 at a LOW level, and the voltage provided from the RFV line 68 at the reference voltage $V_{REF}$. In other words, at the time t10, the switch 62 is switched to a non-conductive state (turned OFF) while the switch 63, the switch 64, and the switch 65 are maintained in a non-conductive state (OFF), and the voltage provided from the RFV line 68 is maintained at the reference voltage $V_{REF}$.

In this way, it is possible to ensure that the switch 62 is switched to a non-conductive state (turned OFF) before the switch 65 is switched to a conductive state (turned ON) in the following period T11 (light-emitting period).

It should be noted that in the case where the period T11 is not provided and the switch 65 and the switch 62 are simultaneously switched to a conductive state (turned ON), the drain current of the drive transistor 61 increases the potential at the node B and changes the potential at the node A to the data signal voltage, thereby decreasing the voltage between the source electrode and the gate electrode of the drive transistor 61. In this case, there is a problem that light having luminance lower than the desired luminance is emitted. In order to prevent this problem, in the present embodiment, the period T10 is provided to ensure that the switch 62 is switched to a non-conductive state (turned OFF), and then in the following period T11, the switch 65 is switched to a conductive state (turned ON).

<Period T11: Light-emitting Period>

Next, the period T11 between time t11 and time t12 in FIG. 3 is a light-emitting period for causing the EL element 66 to emit light.

Figure 4E:
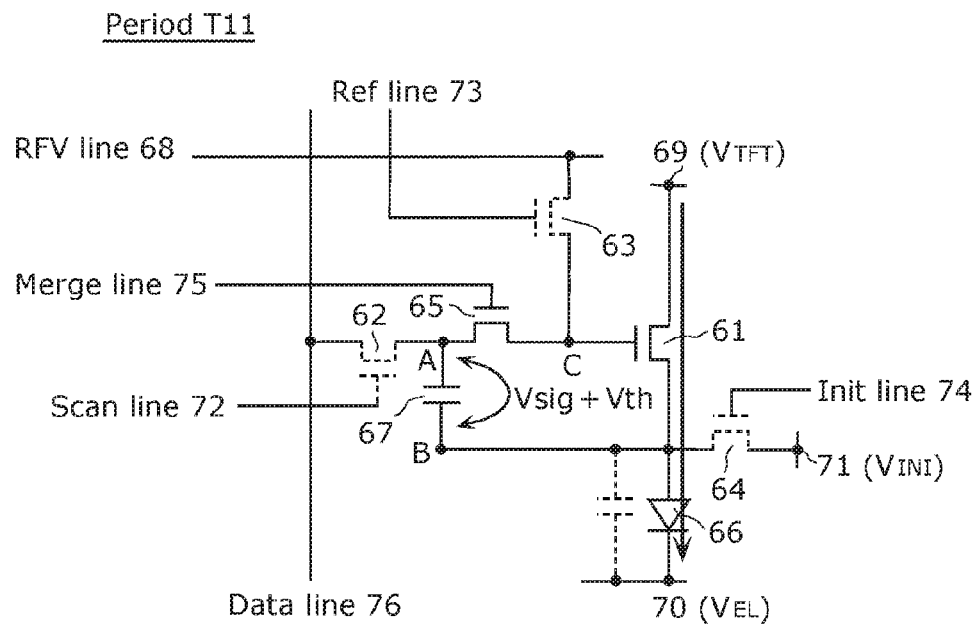
FIG. 4E is a diagram showing another exemplary behavior of the pixel circuit in the timing chart of FIG. 3.

More specifically, as shown in the behavior of the pixel circuit 60 of FIG. 4E, at the time t11, the scan-line driver 3 changes the voltage level of the Merge line 75 from a LOW level to a HIGH level while maintaining the voltage levels of the Scan line 72, the Ref line 73, and the Init line 74 at a LOW level, and the voltage provided from the RFV line 68 at the reference voltage $V_{REF}$. In other words, at the time t11, the switch 65 is switched to a conductive state (turned ON) while the switch 62, the switch 63, and the switch 64 are maintained in a non-conductive state (OFF) and the voltage provided from the RFV line 68 is maintained at the reference voltage $V_{REF}$.

Thus, the switch 65 is switched to a conductive state (turned ON). Accordingly, it is possible to provide current to the EL element 66 through the drive transistor 61 according to the voltage (data signal voltage) stored in the capacitor 67, thereby causing the EL element 66 to emit light.

<Period T12>

The period T12 between time t12 and time t1 in FIG. 3 is a black insertion period for prohibiting the EL element 66 from emitting light so as to improve a response to images, for example.

Figure 4F:
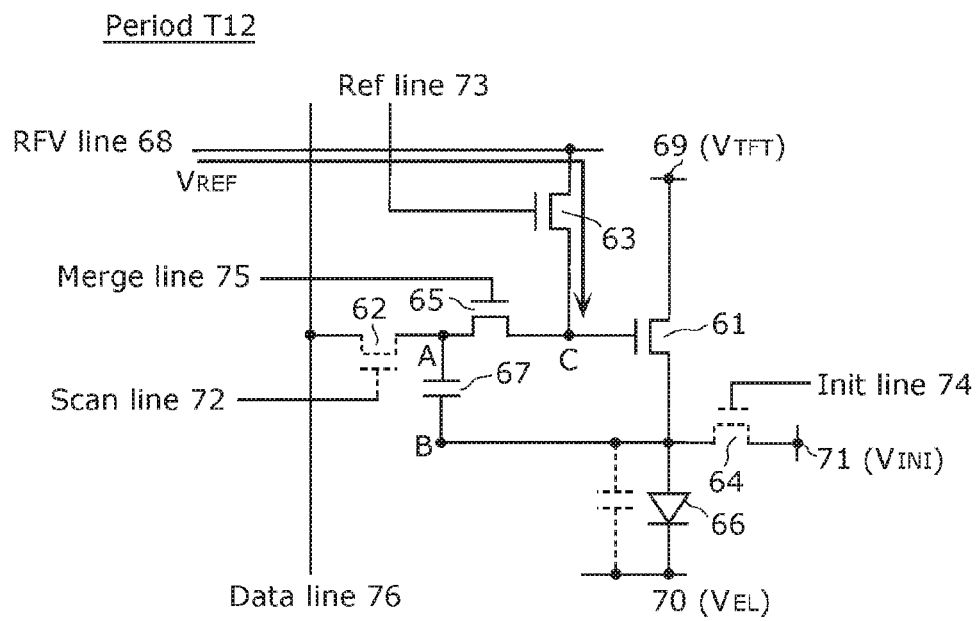
FIG. 4F is a diagram showing another exemplary behavior of the pixel circuit in the timing chart of FIG. 3.

More specifically, as shown in the behavior of the pixel circuit 60 of FIG. 4F, at the time t12, the scan-line driver 3 changes the voltage level of the Ref line 73 from a LOW level to a HIGH level while maintaining the voltage levels of the Scan line 72 and the Init line 74 at a LOW level, the voltage level of the Merge line 75 at a HIGH level, and the voltage provided from the RFV line 68 at the reference voltage $V_{REF}$. In other words, at the time t12, the switch 63 is switched to a conductive state (turned ON) while the switch 62 and the switch 64 are maintained in a non-conductive state (OFF), the switch 65 is maintained in a conductive state (ON), and the voltage provided from the RFV line 68 is maintained at the reference voltage $V_{REF}$.

According to the foregoing sequence, the pixel circuit 60 reproduces the gradation.

It should be noted that the display panel controller 2 sequentially controls the other pixel circuits 60 included in the display panel 6 on a line basis in the same manner.

Thus, the display panel controller 2 performs the steps of: applying the reference voltage $V_{REF}$, which is higher than the threshold voltage Vth of the drive transistor 61 and provides a forward bias between the gate electrode and the source electrode of the drive transistor 61, to the gate electrode of the drive transistor 61 in the period T5 (initialization period) for initializing the pixel circuit 60; and applying the reverse bias voltage $V_{REV}$, which provides a reverse bias between the gate electrode and the source electrode of the drive transistor 61, to the gate electrode of the drive transistor 61 in the period T2 (predetermined period) before the period T5 (initialization period). The period T2 (predetermined period) is provided between the period T11 (light-emitting period) and the period T5 (initialization period).

In this way, it is possible to correct the variation in the threshold voltage Vth of the drive transistor 61 in the period T6 (threshold compensation period) and further reduce the amount of variation in the threshold voltage Vth in the period T2 (reverse bias period). Thus, the amount of variation in the threshold voltage of the drive transistor can be reduced even when it is difficult to ensure an adequate period for the threshold voltage compensation operation. As the result, the pixel circuit 60 can be achieved which is capable of maintaining the threshold voltage Vth within the operable voltage range of the drive transistor 61 for a longer time.

Figure 5:
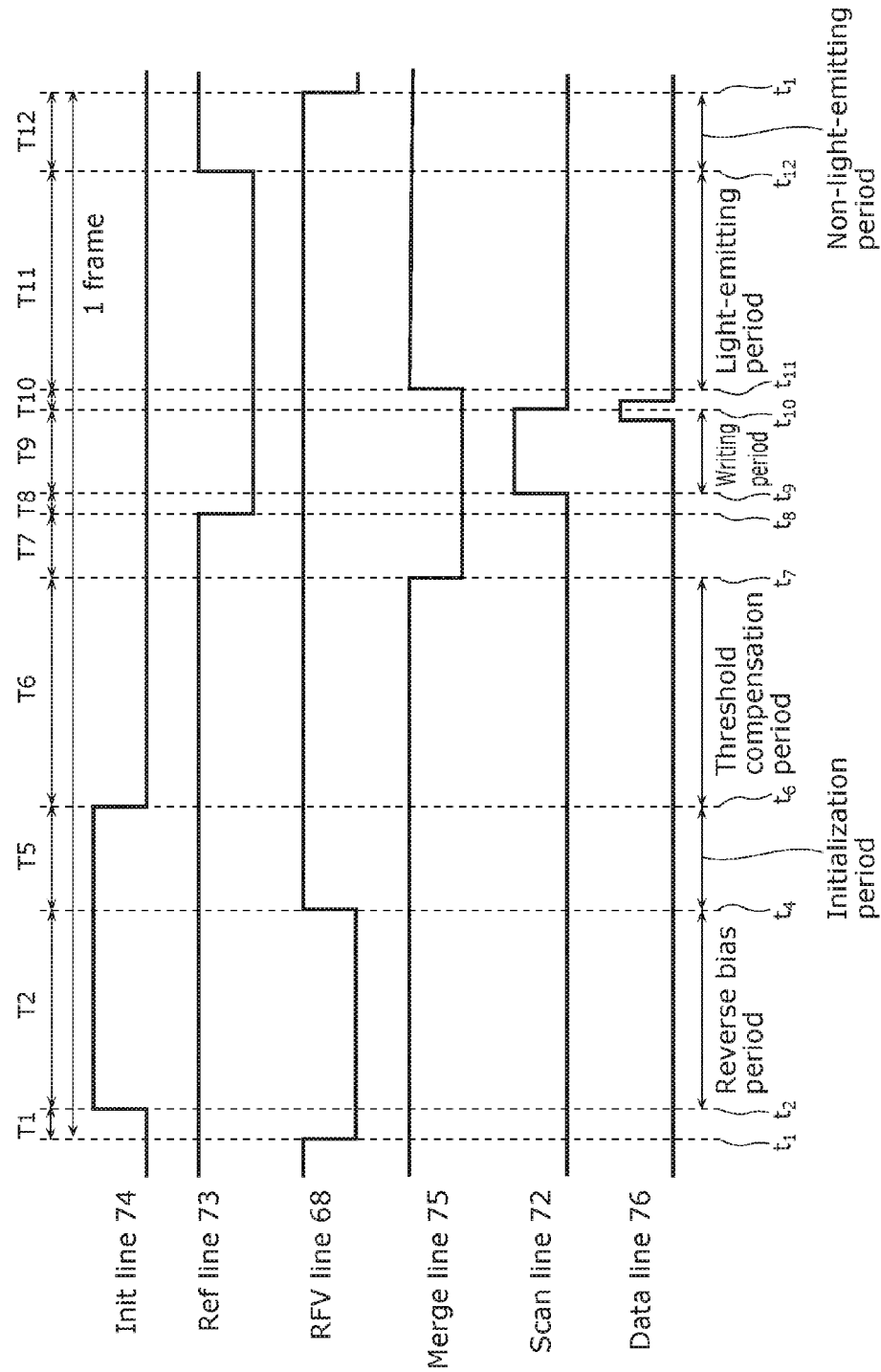
FIG. 5 is a variation of the timing chart of FIG. 3.

It should be noted that, in the present embodiment, the period T3 and the period T4 are provided as shown in FIG. 3, but any other case is possible. For example, as shown in FIG. 5, instead of providing the period T3 and the period T4, the voltage provided from the RFV line 68 may be switched from the reverse bias voltage $V_{REV}$ to the reference voltage $V_{REF}$. FIG. 5 is a variation of the timing chart of FIG. 3.

Furthermore, the description with reference to FIG. 3 is based on the pixel circuit 60 of FIG. 2A, but also may be based on the pixel circuit 60A shown in FIG. 2B. More specifically, the display panel controller 2 conducts the period T3 (predetermined period) by (i) switching the switch 63A to a conductive state (turning ON) while maintaining the switch 62 in a non-conductive state (OFF), the switch 65 in a conductive state (ON), and the switch 64 in a conductive state (ON), and (ii) selecting the power line 68B (third power line) providing the reverse bias voltage $V_{REV}$ through the power selection switch 310 to provide the reverse bias voltage $V_{REV}$ to the gate electrode of the drive transistor 61. The display panel controller 2 also conducts the period T5 (initialization period) by (i) switching the switch 63A to a conductive state (turning ON) while maintaining the switch 62 in a non-conductive state (OFF), the switch 65 in a conductive state (ON), and the switch 64 in a conductive state (ON), and (ii) selecting the power line 68A (second power line) providing the reference voltage $V_{REF}$ through the power selection switch 310 to provide the reference voltage $V_{REF}$ to the gate electrode of the drive transistor 61. The other driving methods are described above, and not further described here.

As described above, in the display device and the driving method thereof according to the embodiment, even when the display device has a thin-film transistor using an oxide semiconductor for a semiconductor layer and includes pixel circuits 60 incapable of ensuring an adequate period for the threshold voltage compensation operation, the amount of variation in the threshold voltage of the drive transistor can be reduced. It is apparent that the thin-film transistor using a silicon semiconductor for the semiconductor layer is advantageous in that the amount of variation in the threshold voltage of the drive transistor can be reduced even when the period for the threshold voltage compensation operation is insufficient.

Thus, the display device and the driving method thereof according to one or more aspects of the present invention have been described based on the embodiment, but the present invention is not limited to this embodiment. Various modifications to the embodiments that can be conceived by those skilled in the art, and forms configured by combining structural elements in different embodiments without departing from the spirit of the present invention may be included in the scope of the one or more aspects.

For example, the EL element 66 is typically an organic light-emitting element, but any other photoelectric conversion device is possible as long as the intensity of light emission varies depending on current.

Figure 6:
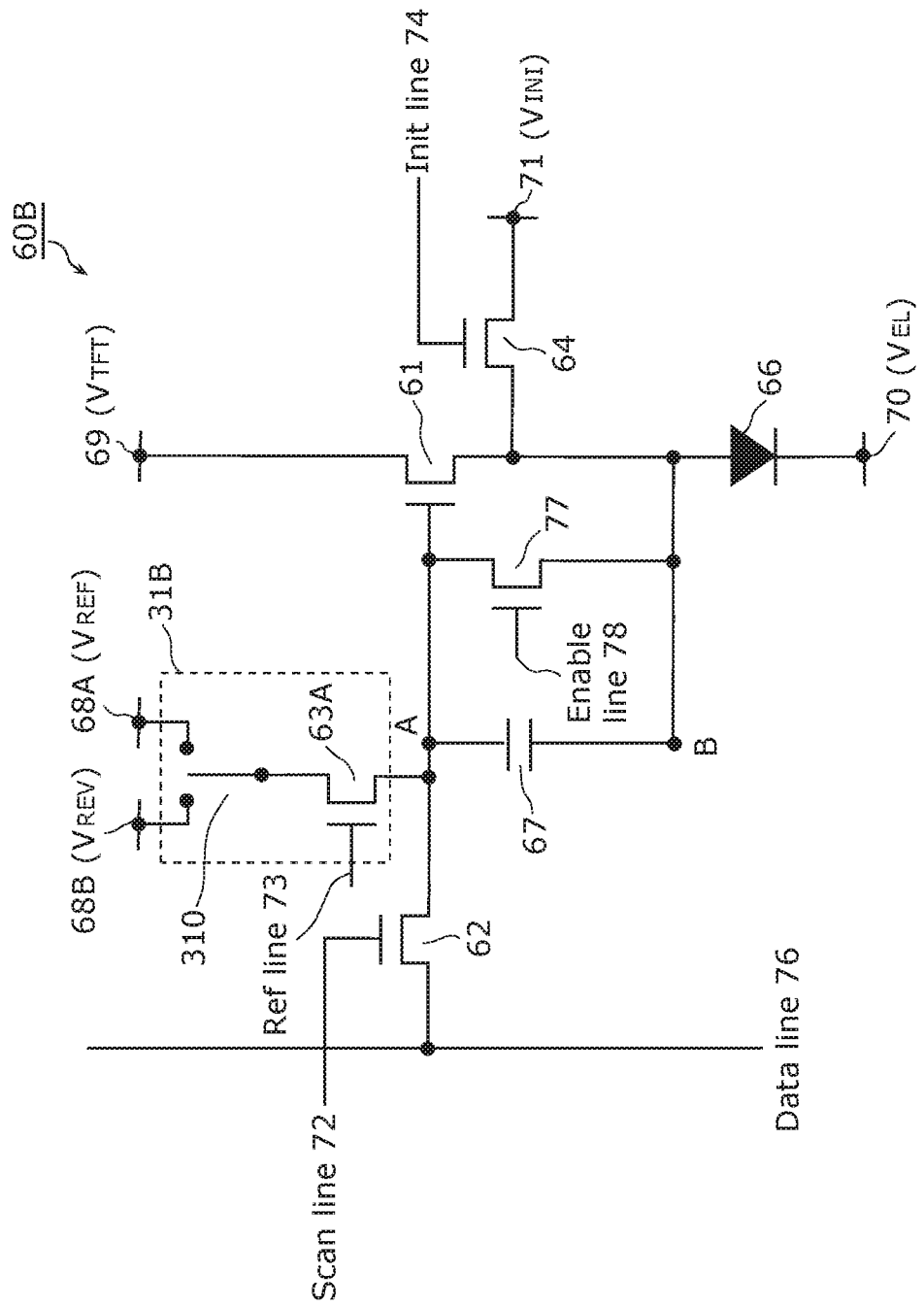
FIG. 6 is a diagram showing a variation of the circuit configuration of FIG. 2B.
Figure 7:
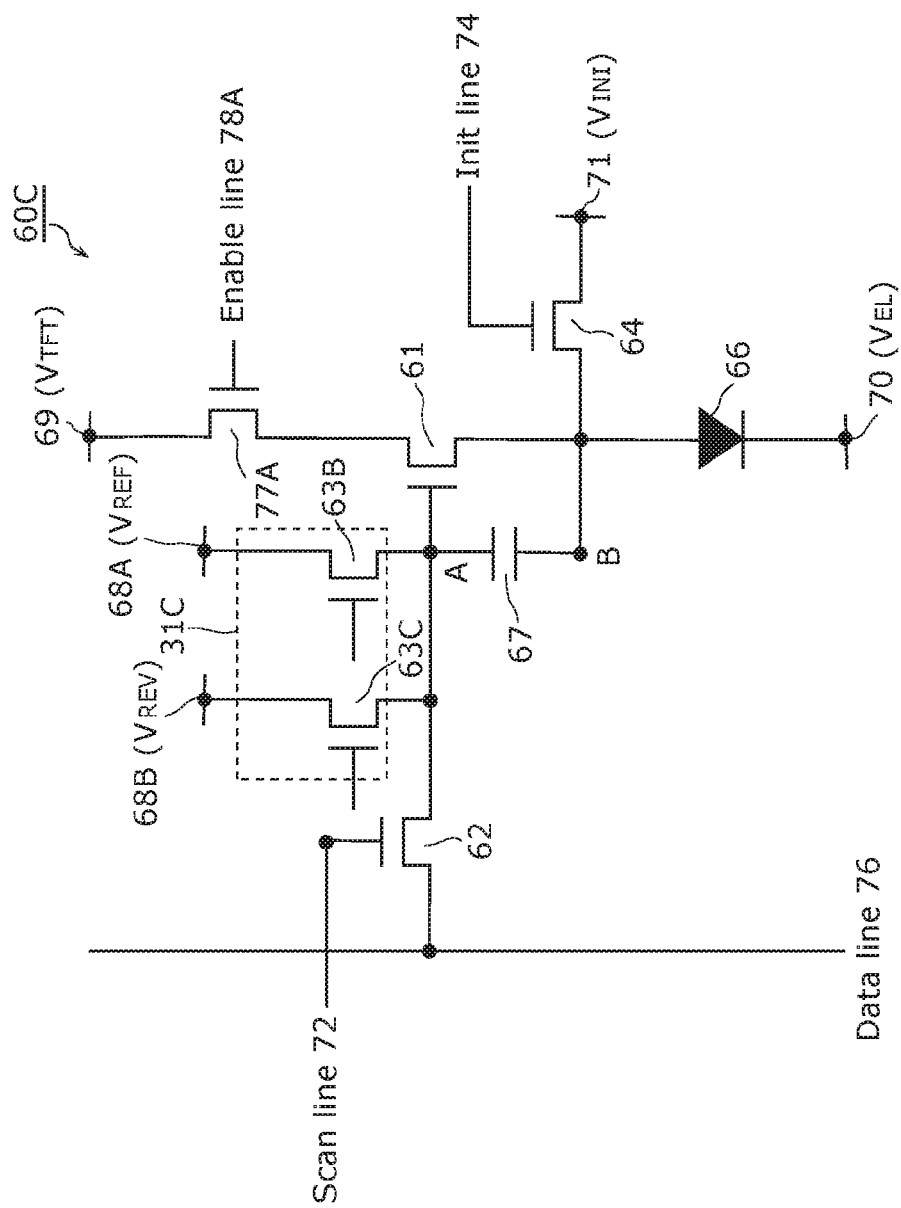
FIG. 7 is a diagram showing another variation of the circuit configuration of FIG. 2B.
Figure 8:
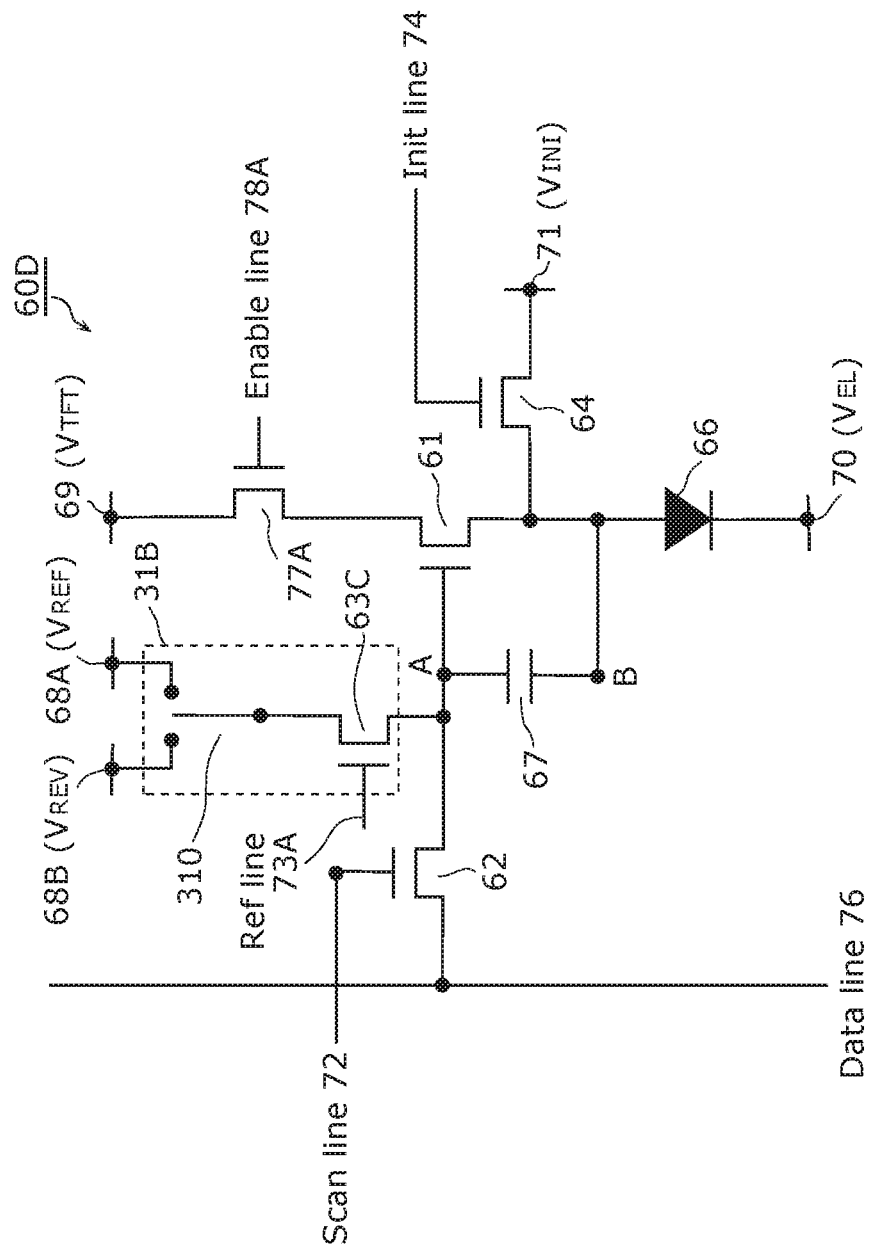
FIG. 8 is a diagram showing another variation of the circuit configuration of FIG. 2B.

Furthermore, for example, the pixel circuit included in the display device according to the present invention is not limited to the pixel circuit 60 and the pixel circuit 60A as described above. For example, the pixel circuits 60B to 60D shown, respectively, in FIG. 6 to FIG. 8 are possible. FIG. 6 to FIG. 8 are each a diagram showing a variation of a circuit configuration of FIG. 2B. It should be note that the elements corresponding to those in FIG. 2A and FIG. 2B are numbered the same, and are not further described in detail.

For example, as shown in FIG. 6, a pixel circuit 60B may include a voltage supplier 31B disposed differently from the voltage supplier 31A in FIG. 2B, and also include, instead of the switch 65 in FIG. 2B, a switch 77 disposed between the gate electrode and the source electrode of the drive transistor 61 and having a gate connected to the Enable line 78. One of the drain and source of the switch 63A included in the voltage supplier 31B is connected between the switch 62 and the node A.

Furthermore, for example, as shown in FIG. 7, a pixel circuit 60C may include a voltage supplier 31C having a configuration different from the voltage supplier 31 in FIG. 2B, and also include, instead of the switch 65 in FIG. 2B, a switch 77A disposed between the drain electrode of the drive transistor 61 and the EL anode power line 69 and having a gate connected to the Enable line 78A. In this case, the voltage supplier 31C includes: a switch 63B that is turned ON and OFF to electrically connect and disconnect the power line 68A (VREF) and the gate electrode of the drive transistor 61; a switch 63C that is turned ON and OFF to electrically connect and disconnect the power line 68B (VREV) and the gate electrode of the drive transistor 61. One of the drain and source of the switch 63B and one of the drain and source of the switch 63C are connected between the switch 62 and the node A.

Furthermore, for example, as shown in FIG. 8, a pixel circuit 60D including a combination of the circuits shown in FIG. 6 and FIG. 7 is possible. In other words, the pixel circuit 60D of FIG. 8 may have the switch 77A in FIG. 7 instead of the switch 77 in FIG. 6.

Furthermore, in the present invention, in the predetermined period before the initialization period (also referred to as the reverse bias period and the period T2), a reverse bias is applied between the gate electrode and the source electrode of the drive transistor 61, and in the initialization period, a forward bias is applied between the gate electrode and the source electrode of the drive transistor 61. In the present embodiment, a bias is applied to the gate electrode of the drive transistor 61, but any other case is possible. A reverse bias may be applied to not the gate electrode but the source electrode of the drive transistor. In this case, for example, the reference voltage $V_{REF}$ is provided from the gate-electrode side, and the initialization voltage $V_{INI}$ or the reverse bias voltage $V_{REV}$ is provided from the source-electrode side. It should be noted that in an example disclosed herein, it is assumed that "Reference voltage $V_{REF}$<Reverse bias voltage $V_{REV}$", and thus the potential difference between the reverse bias voltage $V_{REV}$ and the voltage $V_{EL}$ increases to cause the EL element to emit light. Accordingly, it is further necessary to adjust the voltage $V_{EL}$ so as to be "($V_{EL}$+EL forward threshold voltage)>(Reverse bias voltage $V_{REV}$)".

INDUSTRIAL APPLICABILITY

Figure 9:
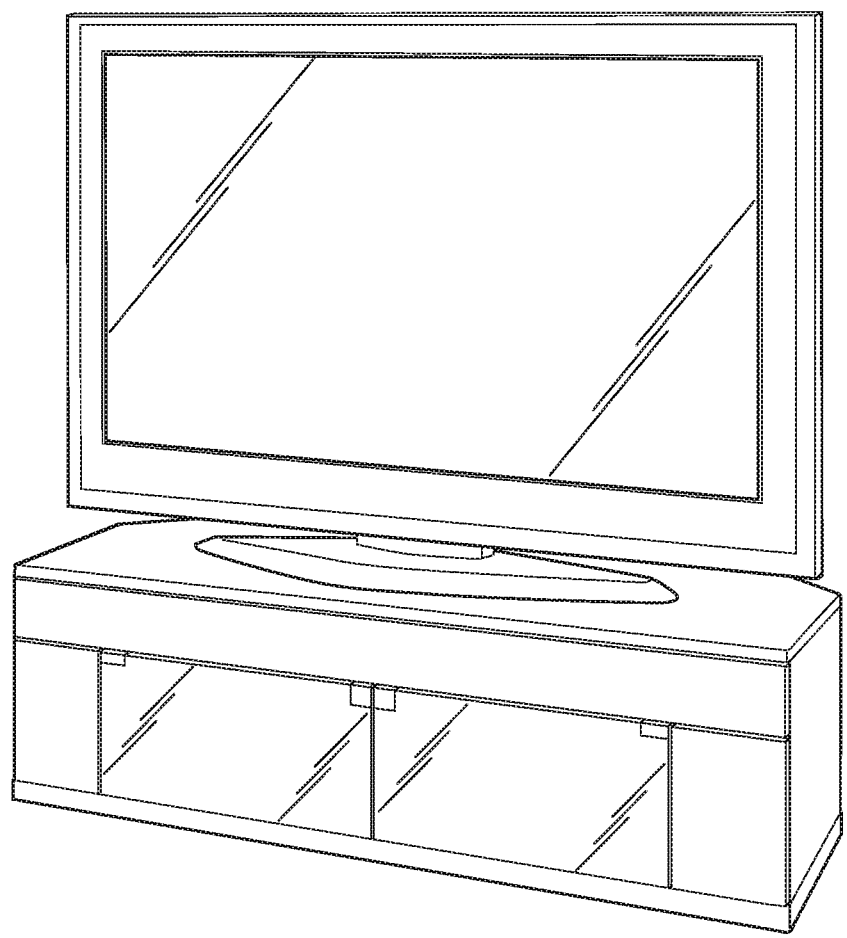
FIG. 9 is an external view of a thin flat-screen TV incorporating the display device disclosed herein.

The present invention is applicable to display devices and driving methods thereof, particularly FPD display devices including a television set as shown in FIG. 9.

REFERENCE SIGNS LIST

1 Display device
2 Display panel controller
3 Scan-line driver
5 Data-line driver 6 Display panel
31, 31A, 31B, 31C Voltage supplier
60, 60A, 60B, 60C, 60D Pixel circuit
61 Drive transistor
62, 63, 63A, 63B, 63C, 64, 65, 77, 77A Switch
66 EL element
67 Capacitor
68 RFV line
68A, 68B Power line
69 EL anode power line
70 EL cathode power line
71 Initialization power line
72 Scan line
73 Ref line
74 Init line
75 Merge line
76 Data line
78, 78A Enable line
310 Power selection switch

The invention claimed is:

1. A display device comprising:
a controller; and
a plurality of pixels arranged in a matrix,
wherein each of the plurality of pixels includes:
 a light emitting element;
 a capacitor for storing voltage;
 a drive transistor that provides, to the light emitting element, a current corresponding to the voltage stored in the capacitor to cause the light emitting element to emit light;
 a voltage supplier that applies a reference voltage to the drive transistor in an initialization period, and applies a reverse bias voltage to the drive transistor in a predetermined period before the initialization period, the reference voltage being higher than a threshold voltage of the drive transistor and providing a forward bias between a gate electrode and a source electrode of the drive transistor, the initialization period being a period for initializing the pixel, the reverse bias voltage providing a reverse bias between the gate electrode and the source electrode of the drive transistor, the predetermined period being included in a period in which the light emitting element does not emit light;
 a first switch that electrically connects a second electrode of the capacitor and a first power line in the initialization period and in the predetermined period;
 a second switch that is turned ON and OFF to electrically connect and disconnect a signal line for providing a data signal voltage and a first electrode of the capacitor; and
 a third switch that is turned ON and OFF to electrically connect and disconnect the first electrode of the capacitor and the gate electrode of the drive transistor,
the voltage supplier includes:
 a power selection switch that selects a second power line or a third power line to provide the reference voltage or the reverse bias voltage, the second power line providing the reference voltage, the third power line providing the reverse bias voltage; and
 a fourth switch that is turned ON and OFF to electrically connect and disconnect the power selection switch and the gate electrode of the drive transistor, and the source electrode of the drive transistor is electrically connected to the second electrode of the capacitor and an anode of the light emitting element, and
wherein the controller:
 in the predetermined period,
 maintains the fourth switch ON while maintaining the second switch OFF, the third switch ON, and the first switch ON, and selects the third power line through the power selection switch to provide the reverse bias voltage; and
 in the initialization period,
 maintains the fourth switch ON while maintaining the second switch OFF, the third switch ON, and the first switch ON, and selects the second power line through the power selection switch to provide the reference voltage.

2. The display device according to claim 1,
wherein the first switch, the second switch, the third switch, the fourth switch, and the drive transistor are each an N-channel thin film transistor.

3. The display device according to claim 1,
wherein the predetermined period is longer than a threshold compensation period for compensating the threshold voltage of the drive transistor, the threshold compensation period being after the initialization period.

4. The display device according to claim 1,
wherein the drive transistor has an oxide semiconductor channel layer.

5. A method of driving a display device having a plurality of pixels which are arranged in a matrix and each of which includes: a light emitting element; a capacitor for storing voltage; a drive transistor that provides, to the light emitting element, a current corresponding to the voltage stored in the capacitor to cause the light emitting element to emit light; a first switch that electrically connects a second electrode of the capacitor and a first power line; a second switch that is turned ON and OFF to electrically connect and disconnect a signal line for providing a data signal voltage and a first electrode of the capacitor; and a third switch that is turned ON and OFF to electrically connect and disconnect the first electrode of the capacitor and the gate electrode of the drive transistor, the drive transistor having a source electrode electrically connected to the second electrode of the capacitor and an anode of the light emitting element, the method comprising:
 applying a reference voltage to the drive transistor in an initialization period, the reference voltage being higher than a threshold voltage of the drive transistor and providing a forward bias between a gate electrode and a source electrode of the drive transistor, the initialization period being a period for initializing the pixel; and
 applying a reverse bias voltage to the drive transistor in a predetermined period before the initialization period, the reverse bias voltage providing a reverse bias between the gate electrode and the source electrode of the drive transistor, the predetermined period being included in a period in which the light emitting element does not emit light,
wherein,
in the applying of a reverse bias voltage,
the first switch is turned ON while maintaining the second switch OFF, the third switch ON, and a fourth switch ON, and a third power line is selected through a power selection switch to provide the reverse bias voltage, the fourth switch being turned ON and OFF to electrically connect and disconnect to the gate electrode of the drive transistor when a second power line or the third power line is selected to provide the reference voltage or the reverse bias voltage, the second power line providing the reference voltage, the third power line providing the reverse bias voltage, and in the applying of a reference voltage, the fourth switch is turned ON while maintaining the second switch OFF, the third switch ON, and the first switch ON, and the second power line is selected through the power selection switch to provide the reference voltage.

\* \* \* \* \*